(12) United States Patent
Im et al.

(10) Patent No.: US 11,232,754 B2
(45) Date of Patent: Jan. 25, 2022

(54) DISPLAY DEVICE

(71) Applicant: SAMSUNG DISPLAY CO., LTD., Yongin-si (KR)

(72) Inventors: Ki Ju Im, Suwon-si (KR); Tae Young Kim, Seongnam-si (KR); Hyo Jung Kim, Goyang-si (KR); Jong Woo Park, Seongnam-si (KR); Young Tae Choi, Cheonan-si (KR); Hyun Cheol Hwang, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 46 days.

(21) Appl. No.: 16/786,045

(22) Filed: Feb. 10, 2020

(65) Prior Publication Data
US 2020/0258453 A1 Aug. 13, 2020

(30) Foreign Application Priority Data

Feb. 11, 2019 (KR) ........................ 10-2019-0015474

(51) Int. Cl.
| | |
|---|---|
| *G09G 3/3266* | (2016.01) |
| *G09G 3/3233* | (2016.01) |
| *H01L 27/32* | (2006.01) |
| *H01L 29/786* | (2006.01) |
| *H01L 29/06* | (2006.01) |
| *G09G 3/3275* | (2016.01) |

(52) U.S. Cl.
CPC ......... *G09G 3/3266* (2013.01); *G09G 3/3233* (2013.01); *G09G 3/3275* (2013.01); *H01L 27/3258* (2013.01); *H01L 27/3262* (2013.01); *H01L 27/3276* (2013.01); *H01L 29/0684* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 8,836,877 B2* | 9/2014 | Choi | .................... H01L 29/7869 349/43 |
| 2014/0349445 A1* | 11/2014 | Choi | .................. H01L 27/1288 438/104 |

FOREIGN PATENT DOCUMENTS

| | | |
|---|---|---|
| KR | 10-1136298 | 11/2006 |
| KR | 10-1838297 | 3/2013 |
| KR | 10-2017-0045428 | 4/2017 |
| WO | 2017/123552 | 7/2017 |

\* cited by examiner

*Primary Examiner* — Ashok Patel
(74) *Attorney, Agent, or Firm* — F. Chau & Associates, LLC

(57) ABSTRACT

A display device includes: a substrate; a gate pattern disposed on the substrate; an oxide semiconductor layer disposed on the substrate, the oxide semiconductor layer includes a channel region that overlaps with the gate pattern; and an insulating film disposed on the gate pattern, the insulating film includes majority carrier supporting ions, wherein the gate pattern includes a plurality of gate holes, wherein the gate holes are formed inside a region of the gate pattern that does not overlap with the channel region of the oxide semiconductor layer, and wherein the channel region of the oxide semiconductor layer includes the majority carrier supporting ions.

20 Claims, 19 Drawing Sheets

FIG.14
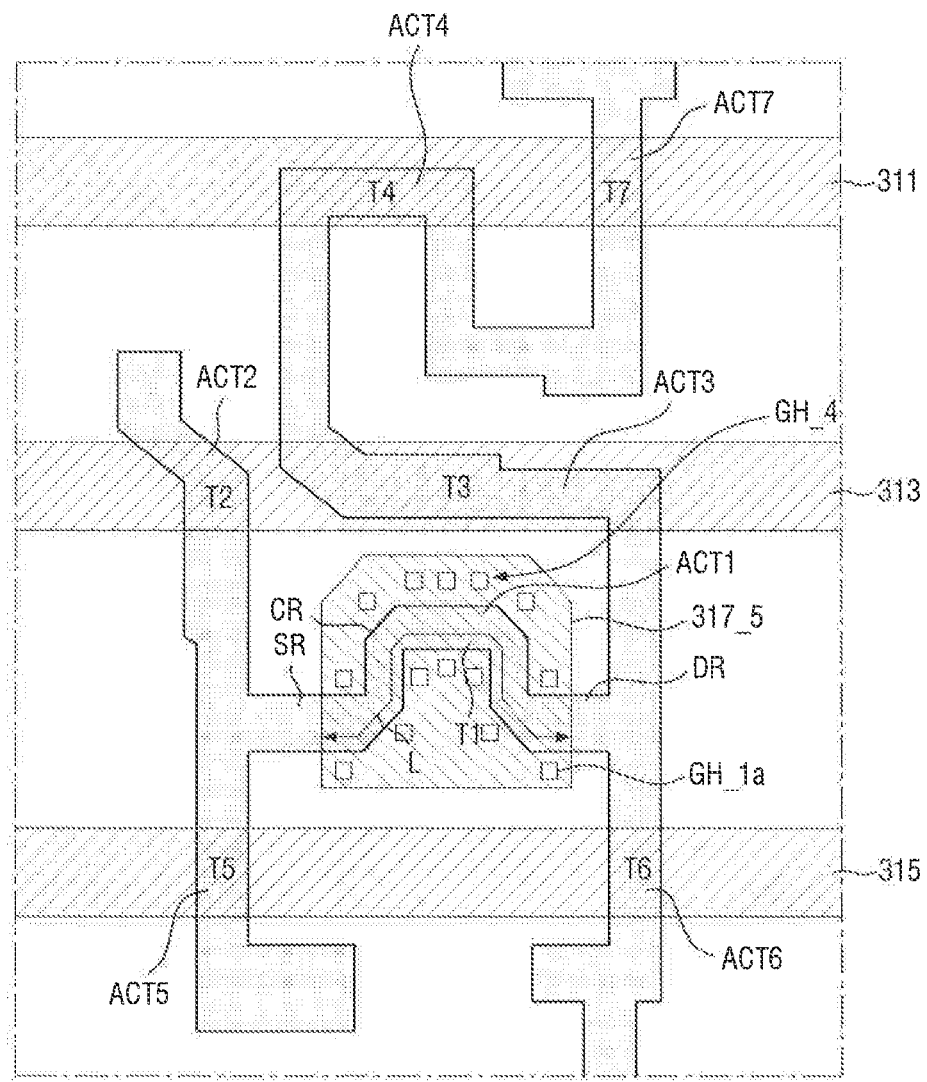
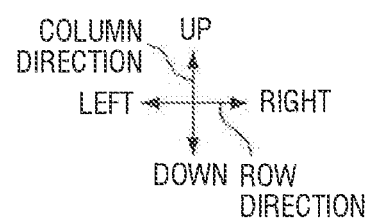

FIG.15
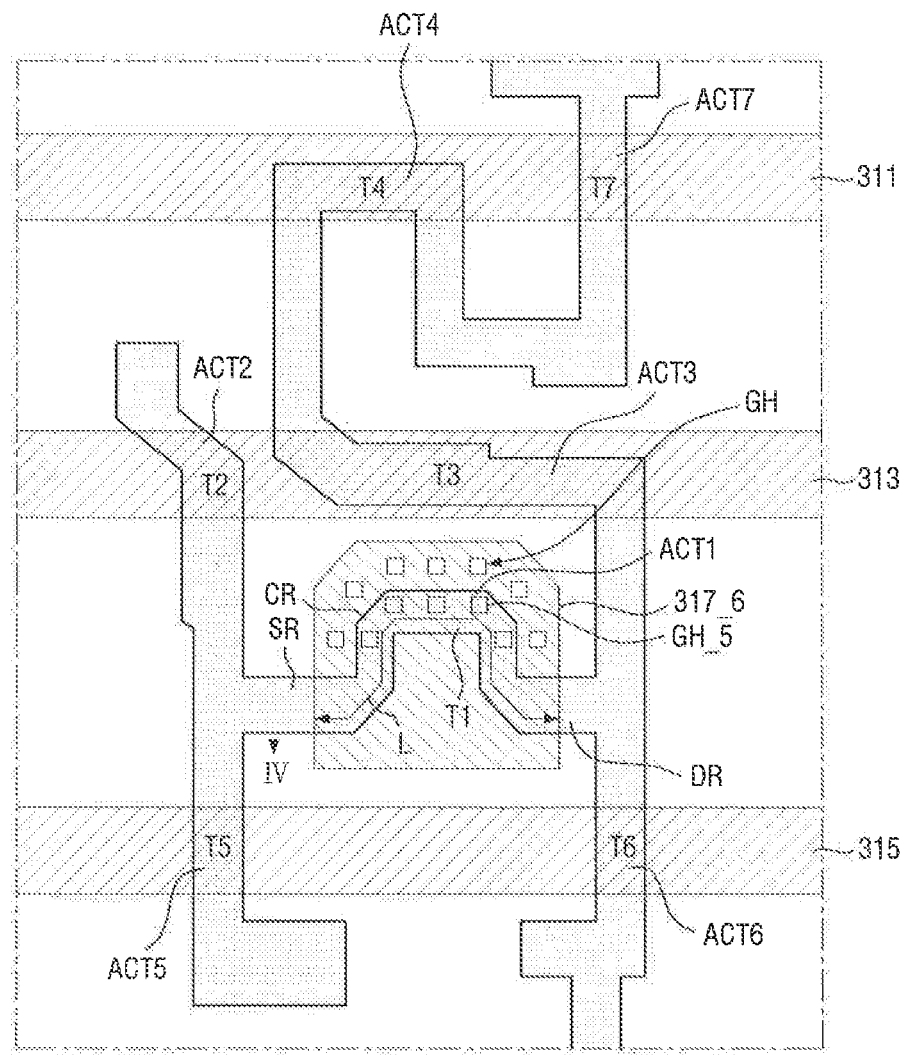
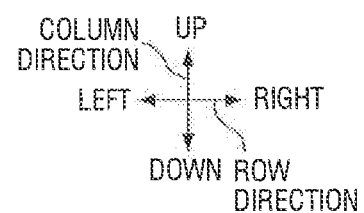

FIG.18
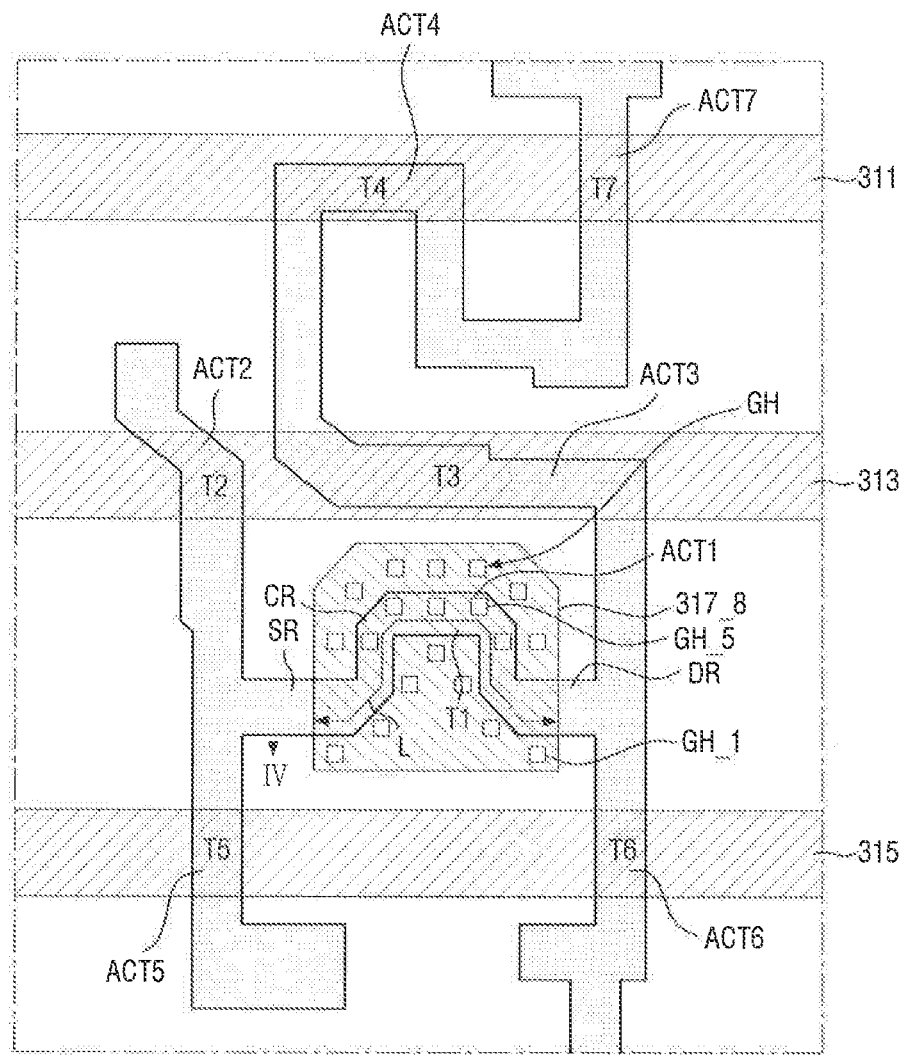
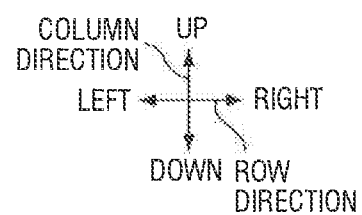

DISPLAY DEVICE

CROSS-REFERENCE TO RELATED APPLICATION

This application claims priority under 35 U.S.C. § 119 to Korean Patent Application No. 10-2019-0015474 filed on Feb. 11, 2019 in the Korean Intellectual Property Office, the disclosure of which is incorporated by reference herein in its entirety.

TECHNICAL FIELD

The present invention relates to a display device, and more particularly, to a display device including a driving transistor with a gate electrode including a plurality of holes.

DISCUSSION OF THE RELATED ART

The desire for display devices has increased with the development of multimedia. Correspondingly, various kinds of display devices such as a liquid crystal display (LCD) device and an organic light emitting diode (OLED) display device have been used. The OLED display device displays images using an organic light emitting element that generates light by recombination of electrons and holes. Typically, an OLED display device includes a plurality of transistors that provide a driving current to the organic light emitting element.

SUMMARY

According to an exemplary embodiment of the present invention, a display device includes: a substrate; a gate pattern disposed on the substrate; an oxide semiconductor layer disposed on the substrate, the oxide semiconductor layer includes a channel region that overlaps with the gate pattern; and an insulating film disposed on the gate pattern, the insulating film includes majority carrier supporting ions, wherein the gate pattern includes a plurality of gate holes, wherein the gate holes are formed inside a region of the gate pattern that does not overlap with the channel region of the oxide semiconductor layer, and wherein the channel region of the oxide semiconductor layer includes the majority carrier supporting ions.

In an exemplary embodiment of the present invention, the insulating film includes silicon nitride (SiNx) and is configured to provide the majority carrier supporting ions to the channel region of the oxide semiconductor layer via the plurality of gate holes.

In an exemplary embodiment of the present invention, the majority carrier supporting ions include hydrogen ions.

In an exemplary embodiment of the present invention, the oxide semiconductor layer further includes a source region and a drain region, wherein the source region is disposed adjacent to the channel region, wherein the drain region is spaced apart from the source region, and wherein the channel region is disposed between source region and the drain region.

In an exemplary embodiment of the present invention, the source region and the drain region do not overlap with the gate pattern in a thickness direction.

In an exemplary embodiment of the present invention, a concentration of the majority carrier supporting ions in the source region and the drain region is higher than a concentration of the majority carrier supporting ions in the channel region.

In an exemplary embodiment of the present invention, the display device further includes a source electrode and a drain electrode disposed on the insulating film, wherein the source electrode contacts the source region, wherein the drain electrode contacts the drain region, and wherein the oxide semiconductor layer, the gate pattern, the source electrode, and the drain electrode constitute a transistor.

In an exemplary embodiment of the present invention, the display device further includes a light emitting diode, wherein the transistor includes a driving transistor configured to transmit a driving current to the light emitting diode.

In an exemplary embodiment of the present invention, a concentration of the majority carrier supporting ions is substantially uniform in the channel region.

In an exemplary embodiment of the present invention, a minimum concentration of the majority carrier supporting ions in the channel region is within 0.9 times a maximum concentration of the majority carrier supporting ions in the channel region.

In an exemplary embodiment of the present invention, the plurality of gate holes are at least partially surrounded by the gate pattern and pass through the gate pattern from a surface of the gate pattern.

In an exemplary embodiment of the present invention, the plurality of gate holes are arranged in a direction in which the channel region of the oxide semiconductor layer extends.

In an exemplary embodiment of the present invention, the gate pattern includes a first gate pattern region, a second gate pattern region, and a third gate pattern region that overlaps with the channel region of the oxide semiconductor layer and is disposed between the first gate pattern region and the second gate pattern region; and the gate holes are disposed in the first gate pattern region and the second gate pattern region.

In an exemplary embodiment of the present invention, an arrangement density of the plurality of gate holes increases toward a central portion of the channel region of the oxide semiconductor layer.

In an exemplary embodiment of the present invention, the plurality of gate holes of the gate pattern are further disposed in a region of the gate pattern overlapping with the channel region of the oxide semiconductor layer.

In an exemplary embodiment of the present invention, an arrangement density of the plurality of gate holes disposed in the region of the gate pattern overlapping with the channel region is lower than an arrangement density of the plurality of gate holes disposed in the region of the gate pattern not overlapping with the channel region.

According to an exemplary embodiment of the present invention, a display device includes: a substrate; a gate pattern disposed on the substrate; an oxide semiconductor layer disposed on the substrate, the oxide semiconductor layer includes a channel region that overlaps with the gate pattern; and an insulating film disposed on an upper portion of the gate pattern, wherein the gate pattern includes a plurality of gate holes, wherein the gate holes are formed inside a region of the gate pattern that does not overlap with the channel region of the oxide semiconductor layer, wherein the insulating film is configured to provide majority carrier supporting ions to the channel region of the oxide semiconductor layer via the plurality of gate holes, and a concentration of the majority carrier supporting ions is substantially uniform in the channel region of the oxide semiconductor layer.

In an exemplary embodiment of the present invention, the majority carrier supporting ions include hydrogen ions, and a minimum concentration of the hydrogen ions in the channel region is within 0.9 times a maximum concentration of the hydrogen ions in the channel region.

In an exemplary embodiment of the present invention, the plurality of gate holes of the gate pattern are further disposed in a region of the gate pattern that overlaps with the channel region of the oxide semiconductor layer.

In an exemplary embodiment of the present invention, an arrangement density of the plurality of gate holes disposed in the region of the gate pattern overlapping with the channel region is lower than an arrangement density of the plurality of gate holes disposed in the region of the gate pattern not overlapping with the channel region.

BRIEF DESCRIPTION OF THE DRAWINGS

The above and other features of the present invention will become more apparent by describing in detail exemplary embodiments thereof with reference to the accompanying drawings, in which:

FIG. 14 is a layout diagram illustrating an oxide semiconductor layer and gate patterns of a pixel of a display device according to exemplary embodiment of the present invention;

FIG. 15 is a layout diagram illustrating an oxide semiconductor layer and gate patterns of a pixel of a display device according to an exemplary embodiment of the present invention;

FIG. 18 is a layout diagram illustrating an oxide semiconductor layer and gate patterns of a pixel of a display device according to exemplary embodiment of the present invention.

DETAILED DESCRIPTION OF THE EMBODIMENTS

Figure 1:
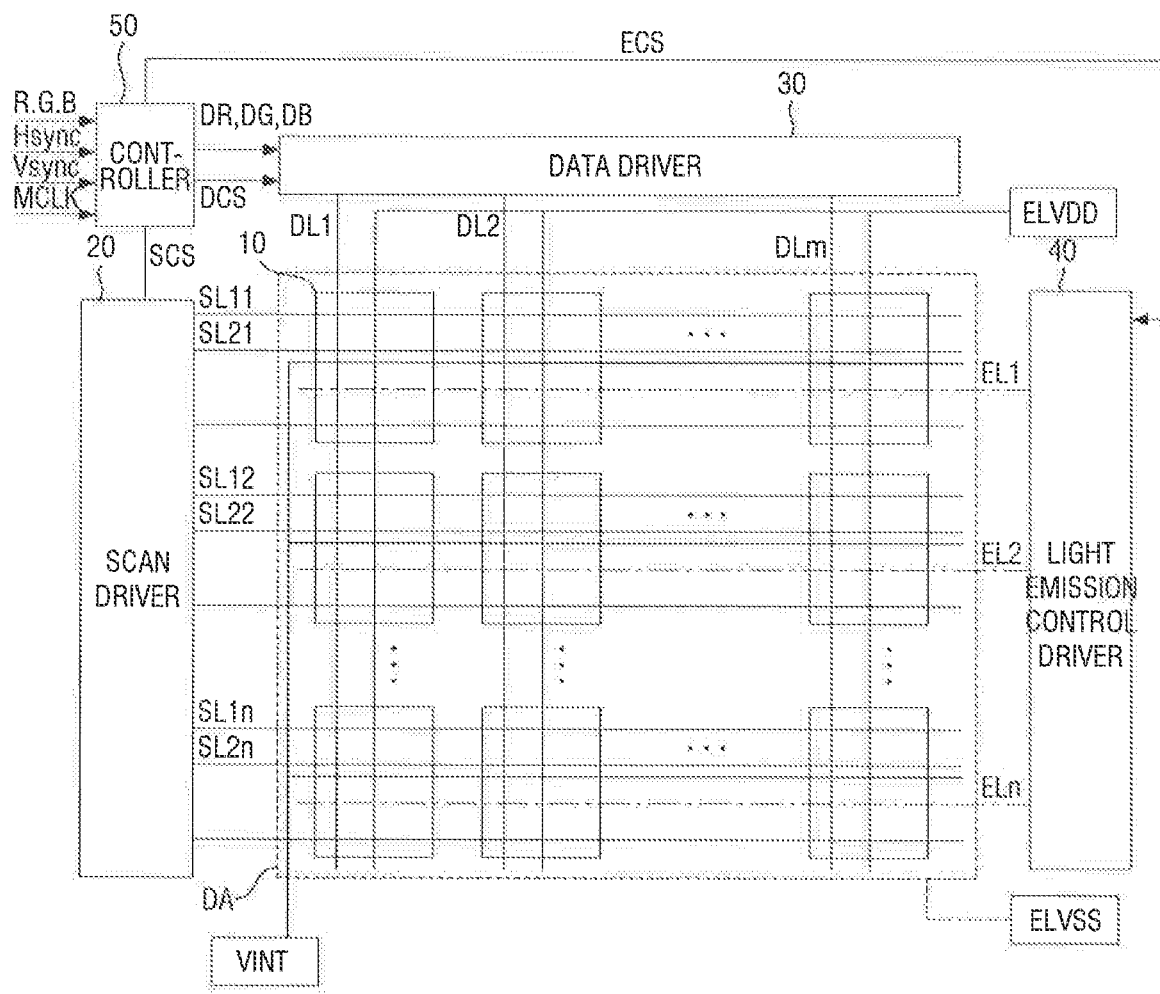
FIG. 1 is a schematic block diagram of a display device according to an exemplary embodiment of the present invention.

Exemplary embodiments of the present invention will be described more fully hereinafter with reference to the accompanying drawings. However, the present disclosure is not limited to exemplary embodiments disclosed below and is realized in various other forms.

It will be understood that when an element or layer is referred to as being "on" another element or layer, the element or layer may be directly on the other element or layer or intervening elements or layers may be present. In addition, like reference numerals may refer to like elements throughout the specification.

Although terms such as first and second are used to describe various elements, the elements are not limited by such terms. Such terms are merely used to differentiate one element from another element. Therefore, a first element may also be a second element within the spirit and scope of the present invention.

Hereinafter, exemplary embodiments of the present invention will be described with reference to the accompanying drawings. An organic light emitting diode (OLED) display device will be described below as an example of a display device.

FIG. 1 is a schematic block diagram of a display device according to an exemplary embodiment of the present invention.

For example, an OLED display device may be applied as a display device 1. Although the case in which an OLED display device is applied as the display device 1 will be described as an example in the following embodiment, the display device 1 is not limited thereto, and other types of display devices such as a liquid crystal display (LCD) device, a quantum dot organic light emitting diode (QD-OLED) display device, a quantum dot liquid crystal display (QD-CD) device, a quantum dot nano light emitting diode (QNED) display device, and a micro light emitting diode (micro LED) device may also be applied as the display device 1.

Referring to FIG. 1, the display device 1 includes a display area DA including a plurality of pixels 10, a scan driver 20, a data driver 30, a light emission control driver 40, and a controller 50. The controller 50 serves to control the scan driver 20, the data driver 30, and the light emission control driver 40.

The display area DA includes the plurality of pixels 10 arranged in a matrix form and disposed at intersections of a plurality of scan lines SL11 to SL1$n$ and SL21 to SL2$n$ (where n is an integer that is 2 or greater), a plurality of data lines DL1 to DLm (where m is an integer that is 2 or greater), and a plurality of light emission control lines EL1 to ELn.

The plurality of scan lines SL11 to SL1$n$ and SL21 to SL2$n$ and the plurality of light emission control lines EL1 to ELn may extend in a row direction, and the plurality of data lines DL1 to DLm may extend in a column direction crossing the row direction. The row direction and the column direction may be reversed. An initialization voltage supply line may be branched for each row and extend in the row direction, and a first source voltage supply line may be branched for each column and extend in the column direction. However, exemplary embodiments of the present invention are not limited thereto, and the directions in which the initialization voltage supply line and the first source voltage supply line extend may be modified in various ways.

Two scan lines SL11 and SL21, one data line DL1, one light emission control line EL1, one initialization voltage supply line, and one first source voltage supply line may cross at a first-row first-column pixel, according to an exemplary embodiment of the present invention. This configuration may apply to another pixel. However, exemplary embodiments of the present invention are not limited thereto, and three scan lines may cross at the first-row first-column pixel.

The scan driver 20 generates two scan signals and transmits the scan signals to each pixel via the plurality of scan lines SL11 to SL1$n$ and SL21 to SL2$n$. For example, the scan driver 20 sequentially supplies scan signals to first scan lines SL11 to SL1$n$ and second scan lines SL21 to SL2$n$.

The data driver 30 transmits a data signal to each pixel 10 via the plurality of data lines DL1 to DLm. When a second scan signal is supplied to the second scan lines SL21 to SL2$n$, a data signal is supplied to a pixel 10 selected by the second scan signal.

The light emission control driver 40 generates a light emission control signal and transmits the light emission control signal to each pixel 10 via the plurality of light emission control lines EL1 to ELn. The light emission control signal controls a light emitting time of the pixel 10. The light emission control driver 40 may be omitted according to an internal structure of the pixel 10 or when the scan driver 20 generates the light emission control signal as well as the scan signal.

The controller 50 converts a plurality of image signals R, G, and B, which are transmitted from the outside, to a plurality of image data signals DR, DG, and DB, and transmits the plurality of image data signals DR, DG, and DB to the data driver 30. In addition, the controller 50 receives a vertical synchronization signal Vsync, a horizontal synchronization signal Hsync, and a clock signal MCLK, generates control signals for controlling driving of the scan driver 20, the data driver 30, and the light emission control driver 40, and transmits the control signals to each of the scan driver 20, the data driver 30, and the light emission control driver 40. For example, the controller 50 generates a scan driving control signal SCS for controlling the scan driver 20, a data driving control signal DCS for controlling the data driver 30, and a light emitting driving control signal ECS for controlling the light emission control driver 40. In addition, the controller 50 transmits the scan driving control signal SCS, the data driving control signal DCS, and the light emitting driving control signal ECS to the scan driver 20, the data driver 30, and the light emission control driver 40, respectively Each of the plurality of pixels 10 receives a first source voltage ELVDD and a second source voltage ELVSS. The first source voltage ELVDD may be a predetermined high-level voltage, and the second source voltage ELVSS may be a voltage lower than the first source voltage ELVDD.

Each of the plurality of pixels 10 emits light of predetermined luminance due to a driving current supplied to a light emitting element according to the data signals transmitted via the plurality of data lines DL1 to DLm.

The first source voltage ELVDD, the second source voltage ELVSS, an initialization voltage VINT, and the like may be supplied from an external voltage source.

Figure 2:
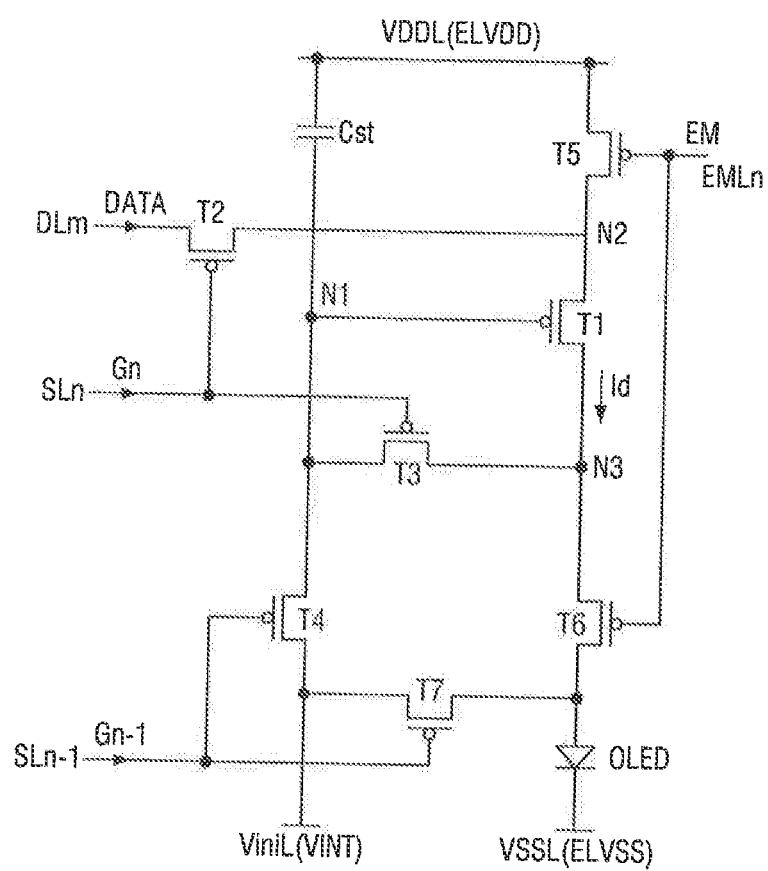
FIG. 2 is a circuit diagram of a pixel of the display device according to an exemplary embodiment of the present invention.

FIG. 2 is a circuit diagram of a pixel of the display device according to an exemplary embodiment of the present invention.

Referring to FIG. 2, a circuit of a pixel of the display device 1 includes an OLED, a plurality of transistors T1 to T7, and a storage capacitor Cst. A data signal DATA, a first scan signal Gn−1, a second scan signal Gn, a light emission control signal EM, the first source voltage ELVDD, the second source voltage ELVSS, and the initialization voltage VINT are applied to the circuit of the pixel.

The OLED includes an anode electrode and a cathode electrode. The storage capacitor Cst includes a first electrode and a second electrode.

The plurality of transistors may include a first to seventh transistors T1 to T7. Each of the transistors T1 to T7 includes a gate electrode, a first electrode, and a second electrode. Any one of a first electrode and a second electrode of each of the transistors T1 to T7 is a source electrode, and the other one is a drain electrode.

Each of the transistors T1 to T7 may be a thin film transistor.

Each configuration will be described in detail below.

A gate electrode of the first transistor T1 is connected to the first electrode of the storage capacitor Cst. The first electrode of the first transistor T1 is connected via the fifth transistor T5 to a first source voltage supply line VDDL which applies the first source voltage ELVDD. The second electrode of the first transistor T1 is connected to the anode electrode of the OLED via the sixth transistor T6. The first transistor T1 receives the data signal DATA according to a switching operation of the second transistor T2 and supplies a driving current Id to the OLED.

A gate electrode of the second transistor T2 is connected to the second scan line SLn which applies the second scan signal Gn. The first electrode of the second transistor T2 is connected to the data line DLm. The second electrode of the second transistor T2 is connected to the first source voltage supply line VDDL, via the fifth transistor T5, while being connected to the first electrode of the first transistor T1. The second transistor 12 is turned on according to the second scan signal Gn and performs a switching operation in which the data signal DATA is transmitted to the first electrode of the first transistor T1 in response to the second scan signal Cm.

A gate electrode of the third transistor T3 is connected to the second scan line SLn which applies the second scan signal Gn. The first electrode of the third transistor T3 is connected to the first electrode of the storage capacitor Cst and the gate electrode of the first transistor T1, and the second electrode of the third transistor T3 is connected to the second electrode of the first transistor T1 and the first electrode of the sixth transistor T6.

A gate electrode of the fourth transistor T4 is connected to a terminal of the first scan signal Gn−1. The first electrode of the fourth transistor T4 is connected to an initialization voltage supply line ViniL and the first electrode of the seventh transistor T7. The second electrode of the fourth transistor T4 is connected to the first electrode of the third transistor T3, the gate electrode of the first transistor T1, and the first electrode of the storage capacitor Cst.

A gate electrode of the fifth transistor T6 is connected to a light emission control line EMLn which applies the light emission control signal EM. The first electrode of the fifth transistor T5 is connected to a terminal of the first source voltage supply line VDDL which supplies the first source voltage ELVDD. The second electrode of the fifth transistor T5 is connected to the first electrode of the first transistor T1 and the second electrode of the second transistor T2.

A gate electrode of the sixth transistor T6 is connected to the light emission control line EMLn which applies the light emission control signal EM. The first electrode of the sixth transistor T6 is connected to the second electrode of the first transistor T1. The second electrode of the sixth transistor T6 is connected to the anode electrode of the OLED.

The fifth transistor T5 and the sixth transistor T6 are simultaneously turned on according to the light emission control signal EM, and accordingly, the driving current Id flows in the OLED.

A gate electrode of the seventh transistor T7 is connected to a first scan line SLn−1 which applies the first scan signal Gn−1, and the first electrode of the seventh transistor T7 is connected to the first electrode of the storage capacitor Cst and the first electrode of the fourth transistor T4. The second electrode of the seventh transistor T7 is connected to the anode electrode of the OLED and the second electrode of the sixth transistor T6.

The second electrode of the storage capacitor Cst is connected to the first source voltage supply line VDDL. The first electrode of the storage capacitor Cst is connected to both the gate electrode of the first transistor T1 and the second electrode of the fourth transistor T4. The cathode electrode of the OLED is connected to a second source voltage supply line VSSL which supplies the second source voltage ELVSS. The OLED receives the driving current Id from the first transistor T1 and emits light, thereby displaying an image.

Hereinafter, a plan layout and a cross-sectional structure of the above-described pixel will be described in detail.

Figure 3:
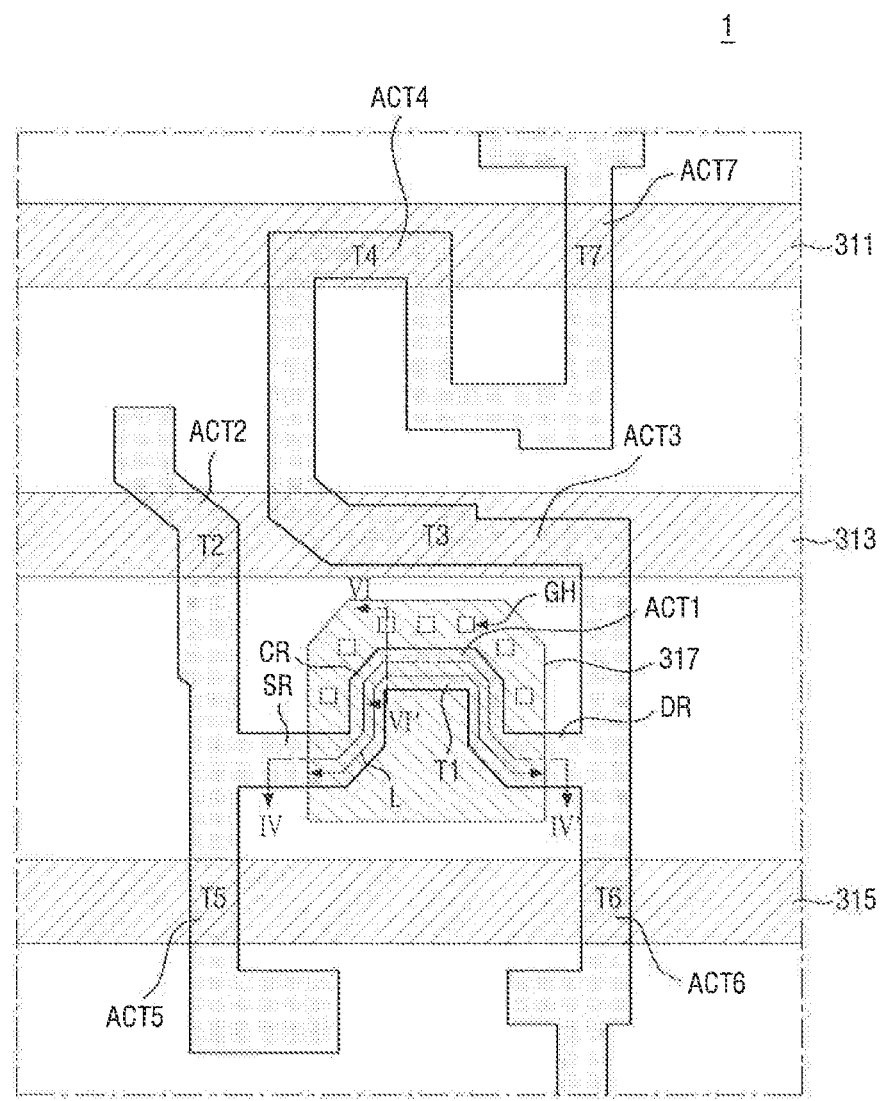
FIG. 3 is a layout diagram illustrating an oxide semiconductor layer and gate patterns of a pixel of a display device according to an exemplary embodiment of the present invention.
Figure 4:
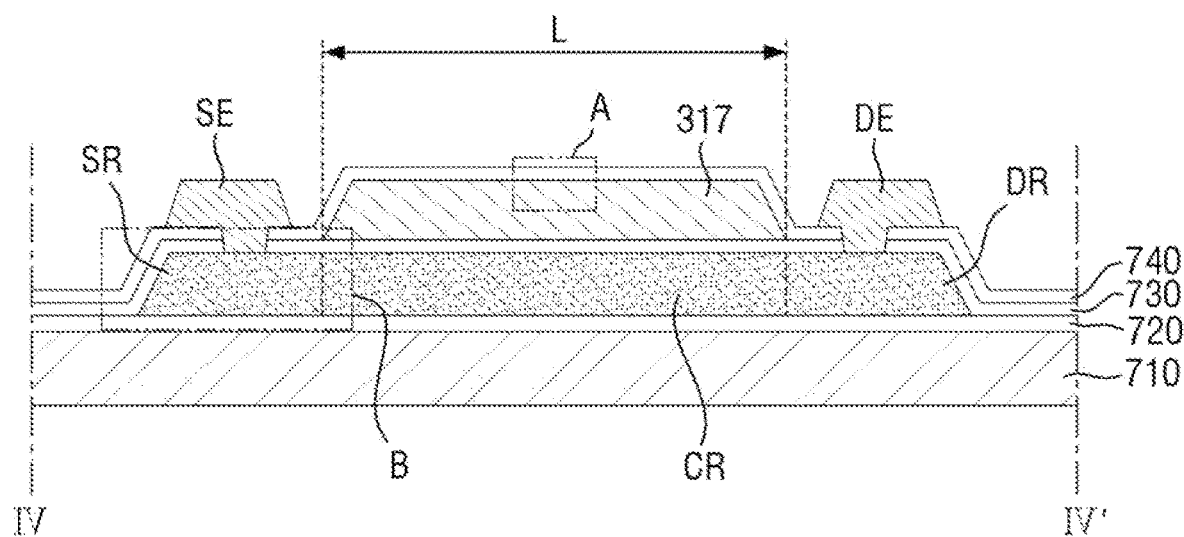
FIG. 4 is a cross-sectional view taken along line IV-IV' of FIG. 3.
Figure 5:
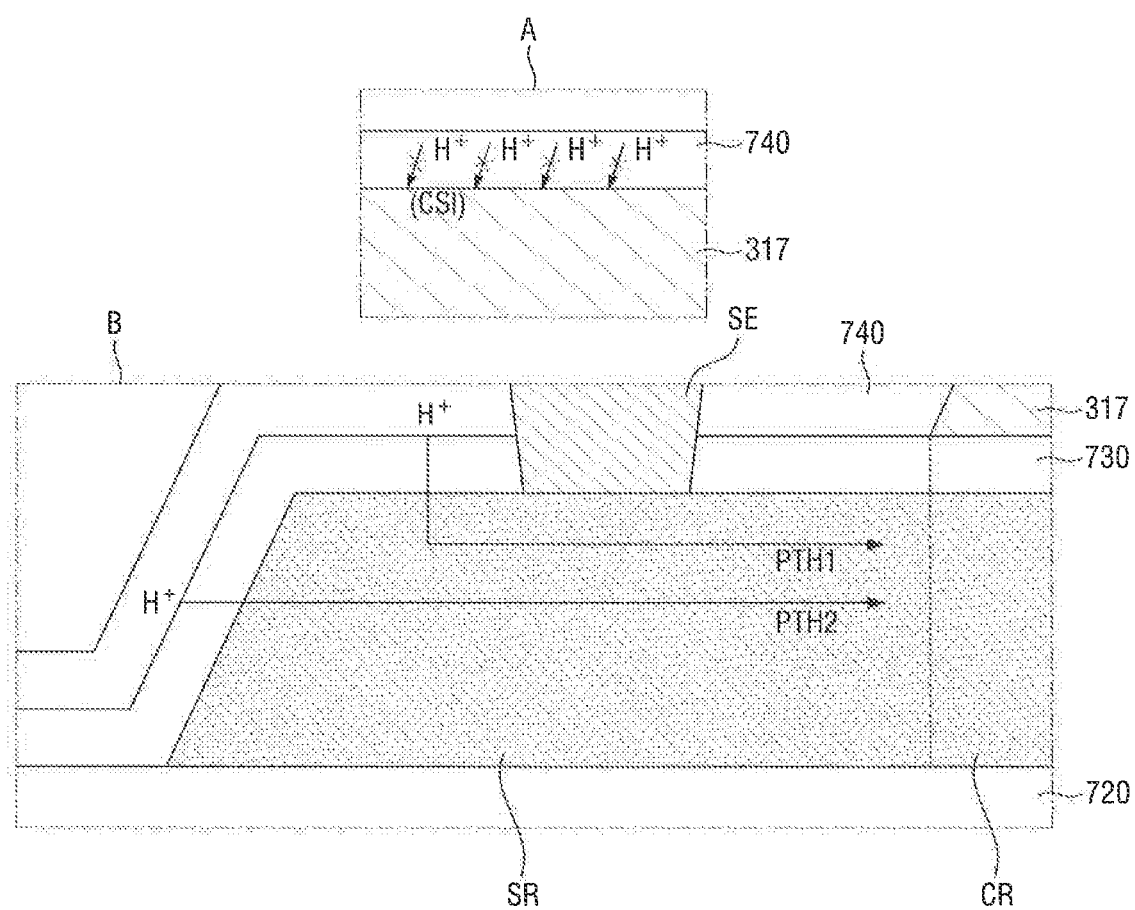
FIG. 5 is an enlarged view of region A and region B of FIG. 4.
Figure 6:
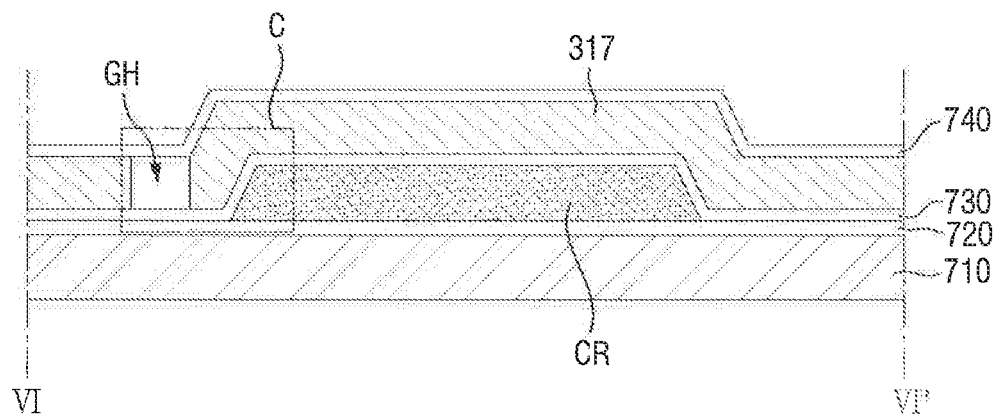
FIG. 6 is a cross-sectional view taken along line VI-VI' of FIG. 4.
Figure 7:
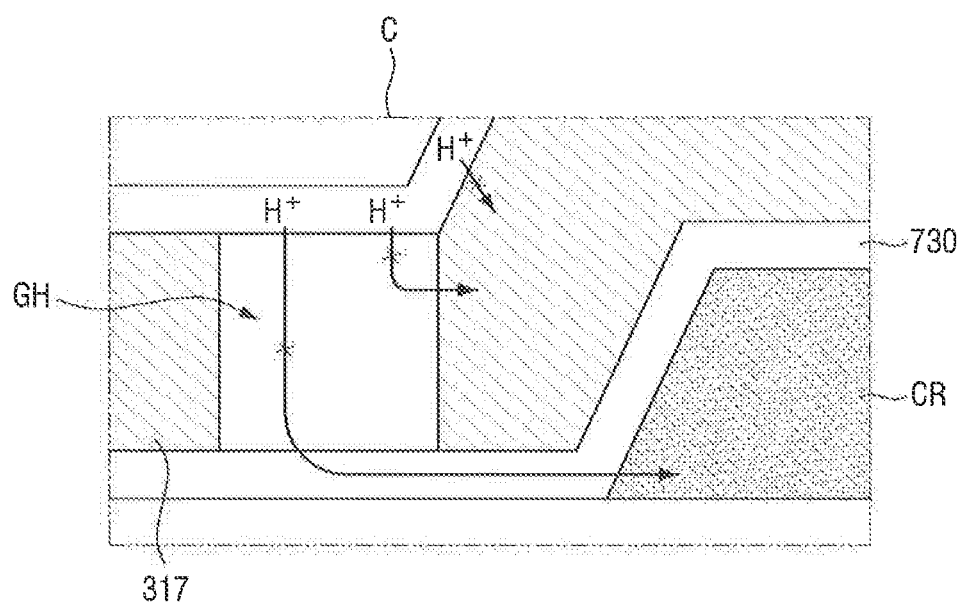
FIG. 7 is an enlarged view of region C of FIG. 6.
Figure 8:
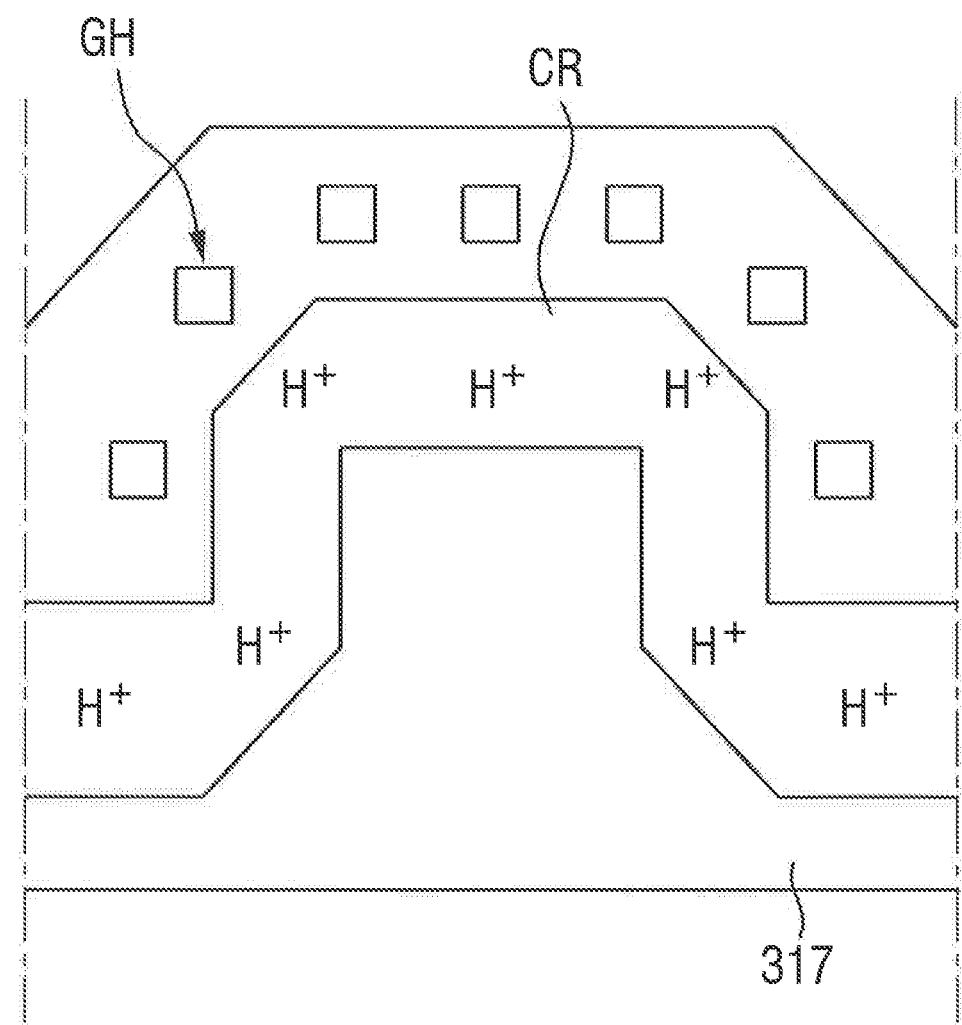
FIG. 8 is a plan view illustrating a gate electrode and a channel region of an oxide semiconductor layer according to an exemplary embodiment of the present invention.

FIG. 3 is a layout diagram illustrating an oxide semiconductor layer and gate patterns of the pixel of the display device according to an exemplary embodiment of the present invention, FIG. 4 is a cross-sectional view taken along line IV-IV' of FIG. 3, FIG. 5 is an enlarged view of region A and region B of FIG. 4, FIG. 6 is a cross-sectional view taken along line VI-VI' of FIG. 4, FIG. 7 is an enlarged view of region C of FIG. 6, and FIG. 8 is a plan view illustrating a gate electrode and a channel region of the oxide semiconductor layer according to an exemplary embodiment of the present invention. For clarity, only the oxide semiconductor layer and the gate patterns are illustrated in FIG. 3 among the configurations of a transistor of a pixel of a display device. Since other configurations are widely known in the art, detailed illustration and description thereof may be omitted.

In the following embodiment, for some elements, new reference numerals may have been assigned to elements which are substantially the same as those mentioned with reference to FIGS. 1 and 2, to facilitate description of arrangement and coupling relationships between elements.

Referring to FIGS. 3 to 8, as described above, a pixel includes a plurality of transistors T1 to T7, a storage capacitor Cst (see FIG. 2), and an OLED (see FIG. 2).

Each of the transistors T1 to T7 include a conductive layer constituting an electrode, a semiconductor layer forming a channel, and an insulating layer. The storage capacitor Cst includes conductive layers constituting an electrode and an insulating layer disposed between the conductive layers. The OLED includes conductive layers constituting an anode electrode and a cathode electrode and an organic light emitting layer disposed therebetween. An electrical connection between the elements may be performed by wirings formed of conductive layers and/or vias made of a conductive material. The above-described conductive material, conductive layer, semiconductor layer, insulating layer, organic light emitting layer, and the like are disposed on a substrate 710.

The layers of the pixel may include the substrate 710, a buffer layer 720, semiconductor layers ACT, a first insulating layer 730, a first conductive layer 310, a second insulating layer 740, and a second conductive layer 320 which are disposed in that order. Each of the layers may be formed of a single film but may also be formed of a lamination film including a plurality of films. For example, another layer may be further disposed between the layers.

For example, the substrate 710 supports the layers disposed thereon. A transparent substrate may be used when the OLED display device is a back-surface light emitting type or both the back-surface light emitting type and front-surface light emitting type. When the OLED display device is the front-surface light emitting type, a semi-transparent or opaque substrate may also be applied as well as a transparent substrate.

The substrate 710 may be made of an insulating material such as glass, quartz, and polymer resin. Examples of the polymer material may include polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or combinations thereof. The substrate 710 may also include a metal material.

For example, the substrate 710 may be a rigid substrate 710 or a flexible substrate 710 that can be bent, folded, rolled, or the like. The flexible substrate 710 may include, for example, a polyimide (PI), but the flexible substrate 710 is not limited thereto.

The buffer layer 720 may be disposed on the substrate 710. For example, the buffer layer 720 may be disposed on an entire surface of the substrate 710. The buffer layer 720 may prevent diffusion of impurity ions, prevent penetration of moisture or outside air, and perform a surface smoothing function. The buffer layer 720 may include, for example, silicon nitride, silicon oxide, silicon oxynitride, or the like. The buffer layer 720 may also be omitted according to the type of the substrate 710 or process conditions.

The semiconductor layers ACT may be disposed on the buffer layer 720. The semiconductor layers ACT may constitute channels of the transistors T1 to T7. The semiconductor layers ACT may be separated from each other for each pixel. The semiconductor layers ACT may have specific patterns in a plan view. In the illustrated example, the semiconductor layers ACT may be integrally formed. In an exemplary embodiment of the present invention, the semiconductor layers ACT may be formed to be disposed on a plurality of layers, but the present invention is not limited thereto.

The semiconductor layers ACT may include a first semiconductor layer ACT1 of the first transistor T1, a second semiconductor layer ACT2 of the second transistor T2, a third semiconductor layer ACT3 of the third transistor T3, a fourth semiconductor layer ACT4 of the fourth transistor T4, a fifth semiconductor layer ACT5 of the fifth transistor T5, a sixth semiconductor layer ACT6 of the sixth transistor T6, and a seventh semiconductor layer ACT7 of the seventh transistor T7.

As illustrated in FIG. 3, the semiconductor layers ACT1 to ACT7 may include a first vertical portion and a second vertical portion which extend substantially in the column direction, a horizontal portion which extends substantially in the row direction, and a bent portion which extends in the column direction from the second vertical portion. The first vertical portion, the second vertical portion, the horizontal portion, and the bent portion may be physically connected to each other.

The first vertical portion may be disposed adjacent to the left side of the pixel, and the second vertical portion may be disposed adjacent to the right side of the pixel. The first vertical portion and the second vertical portion may be disposed to be spaced apart from each other. The horizontal portion may connect middle portions of the first vertical portion and the second vertical portion to each other. In the present disclosure, "upper portion" of each of the first vertical portion and the second vertical portion may indicate a portion disposed above a portion of the horizontal portion connected with each of the first vertical portion and the second vertical portion in a plan view, and "lower portion" thereof may indicate a portion disposed below the portion of the horizontal portion connected with each of the first vertical portion and the second vertical portion in a plan view. The planar shape of the semiconductor layer ACT may be substantially similar to the H-shape.

For example, the second and fifth transistors T2 and T5 may form the first vertical portion. The third, fourth, sixth and seventh transistors T3, T4, T6, and T7 may form the second vertical portion. The first transistor T1 may form the horizontal portion.

The second semiconductor layer ACT2 may be disposed at the upper portion of the first vertical portion, and the fifth semiconductor layer ACT5 may be disposed at the lower portion of the first vertical portion. The sixth semiconductor layer ACT6 may be disposed at the lower portion of the second vertical portion. The third semiconductor layer ACT3, the fourth semiconductor layer ACT4, and the seventh semiconductor layer ACT7 may be disposed at the upper portion of the second vertical portion. The first semiconductor layer ACT1 may be disposed in the horizontal portion.

The bent portion of the semiconductor layer ACT may include a first sub-horizontal portion formed in a left row direction from the second vertical portion, a first sub-vertical portion formed in an upper column direction from the first sub-horizontal portion, a second sub-horizontal portion formed in a right row direction from the first sub-vertical portion, a second sub-vertical portion formed in a lower column direction from the second sub-horizontal portion, a third sub-horizontal portion formed in the right row direction, and a third sub-vertical portion formed in the upper column direction from the third sub-horizontal portion. The third semiconductor layer ACT3 may be disposed in the first sub-horizontal portion, the fourth semiconductor layer ACT4 may be disposed in the first sub-vertical portion, the second sub-horizontal portion, the second sub-vertical portion, and the third sub-horizontal portion, and the seventh semiconductor layer ACT7 may be disposed in the third sub-horizontal portion and the third sub-vertical portion.

The semiconductor layer ACT may be an oxide semiconductor. Although the case in which an oxide semiconductor is applied as the semiconductor layer ACT will be described as an example in the following embodiment, the semiconductor layer ACT is not limited thereto, and may also be formed of an amorphous silicon semiconductor, a polycrystal silicon semiconductor, or the like. When the semiconductor layer ACT is formed of an oxide semiconductor, materials such as indium-gallium-zinc oxide (IGZO), zinc tin oxide (ZTO), and indium tin oxide (ITO) may be used.

In the semiconductor layer ACT, portions (e.g., source and drain regions) connected to source and drain electrodes of each of the transistors T1 to T7 may be doped with carrier supporting ions. The carrier supporting ions may be majority carrier supporting ions that support majority carriers of the semiconductor layer ACT. For example, when N-type metal oxide semiconductor (NMOS) transistors are applied as the transistors T1 to T7, the carrier supporting ions may be majority carrier supporting ions that support electrons which are majority carriers, and when P-type metal oxide semiconductor (PMOS) transistors are applied as the transistors T1 to T7, the carrier supporting ions may be majority carrier supporting ions that support holes which are majority carriers. Since the source and drain regions are doped with the carrier supporting ions, a resistance of the source and drain regions may be lowered as a whole. In addition to the source and drain regions, a channel region may also be doped with the carrier supporting ions. The carrier supporting ions with which the channel region is doped may serve to lower the threshold voltage Vth of each transistor. This will be described below.

Referring to FIGS. 3 and 4, in the case of the first transistor T1, since a source region SR and a drain region DR respectively connected to a source electrode SE and a drain electrode DE, which will be described below, are doped with the carrier supporting ions, it is possible to lower the resistance of the source and drain regions SR and DR of the first transistor T1.

The first insulating layer 730 may be disposed on the semiconductor layer ACT and may be disposed substantially throughout the entire surface of the substrate 710. The first insulating layer 730 may be a gate insulating film having a gate insulating function. The first insulating layer 730 may include, for example, a silicon compound, metal oxide, and the like. For example, the first insulating layer 730 may include silicon oxide, silicon nitride, silicon oxynitride, aluminum oxide, tantalum oxide, hafnium oxide, zirconium oxide, titanium oxide, and the like. These may be used alone or in combination with each other. The first insulating layer 730 may be a single film or a multilayer film formed of lamination films which are made of materials different from each other.

The first conductive layer 310 is disposed on the first insulating layer 730. The first conductive layer 310 includes a plurality of gate patterns. For example, as illustrated in FIG. 3, the first conductive layer 310 may include a first scan line 311 that transmits a first scan signal Gn−1 (see FIG. 2), a second scan line 313 that transmits a second scan signal Gn (see FIG. 2), a light emission control line 315 that transmits a light emission control signal EM (see FIG. 2), and a gate electrode 317 of the first transistor T11.

The transistor according to an exemplary embodiment of the present invention will be described on the basis of an application of a top gate method, in which the first conductive layer 310 including the plurality of gate patterns is disposed on an upper portion of the semiconductor layer ACT. However, a bottom gate method, in which the first conductive layer 310 including the plurality of gate patterns is disposed between the semiconductor layer ACT and the substrate 710, may also be applied to the transistor according to an exemplary embodiment of the present invention.

The first scan line 311 may include the gate electrode of the fourth transistor T4 and the gate electrode of the seventh transistor T7. The second scan line 313 may include the gate electrode of the second transistor T2 and the gate electrode of the third transistor T3, and the light emission control line 315 may include the gate electrode of the fifth transistor T5 and the gate electrode of the sixth transistor T6.

Each of the first scan line 311, the second scan line 313, and the light emission control line 315 may extend in the row direction. Each of the first scan line 311, the second scan line 313, and the light emission control line 315 may cross a boundary of the pixel and extend to a neighboring or adjacent pixel in the row direction.

The first scan line 311 may be disposed at an upper portion of the pixel. The first scan line 311 may overlap with the fourth semiconductor layer ACT4 and constitute the gate electrode of the fourth transistor T4 at the corresponding overlapping portion. The fourth semiconductor layer ACT4 disposed in the upper column direction from the overlapping region may be a first electrode region of the fourth transistor T4, and the fourth semiconductor layer ACT4 disposed in the lower column direction from the overlapping region may be a second electrode region of the fourth transistor T4. For example, a first portion of the of the fourth semiconductor layer ACT4 may overlap the first scan line 311, and second and third portions of the fourth semiconductor layer ACT4 may extend from the first portion of the fourth semiconductor layer ACT4 toward a lower portion of the pixel. The first scan line 311 may overlap with the seventh semiconductor layer ACT7 and constitute the gate electrode of the seventh transistor T7 at the corresponding overlapping portion. The seventh semiconductor layer ACT7 disposed in the upper column direction from the overlapping region may be a second electrode region of the seventh transistor T7, and the seventh semiconductor layer ACT7 disposed in the lower column direction from the overlapping region may be a first electrode region of the seventh transistor T7.

The second scan line 313 may be disposed in the lower column direction from the first scan line 311. The second scan line 313 may overlap with the second semiconductor layer ACT2 and constitute the gate electrode of the second transistor T2 at the corresponding overlapping portion. The second semiconductor layer ACT2 disposed in the upper column direction from the overlapping region may be a first electrode region of the second transistor T2, and the second semiconductor layer ACT2 disposed in the lower column direction from the overlapping region may be a second electrode region of the second transistor T2.

In addition, the second scan line 313 may overlap with the third semiconductor layer ACT3 and constitute the gate electrode of the third transistor T3 at the corresponding overlapping portion. The a portion of the third semiconductor layer ACT3 disposed at the left of and extending in the upper column direction from the overlapping region, that is, the first vertical portion of the third semiconductor layer ACT3 may be a first electrode region of the third transistor T3, and the third semiconductor layer ACT3 disposed at the right of and extending in the lower column direction from the overlapping region may be a second electrode region of the third transistor T3.

The light emission control line 315 may be disposed in the lower column direction from the second scan line 313 in a plan view. The light emission control line 315 may overlap with the fifth semiconductor layer ACT5 and constitute the gate electrode of the fifth transistor T5 at the corresponding overlapping portion. The fifth semiconductor layer ACT5 disposed in the lower column direction from the overlapping region may be a first electrode region of the fifth transistor T5, and the fifth semiconductor layer ACT5 disposed in the upper column direction from the overlapping region may be a second electrode region of the fifth transistor T5.

In addition, the light emission control line 315 may overlap with the sixth semiconductor layer ACT6 and constitute the gate electrode of the sixth transistor T6 at the corresponding overlapping portion. The sixth semiconductor layer ACT6 disposed in the upper column direction from the overlapping region may be a first electrode region of the sixth transistor T6, and the sixth semiconductor layer ACT6 disposed in the lower column direction from the overlapping region may be a second electrode region of the sixth transistor T6.

The gate electrode 317 of the first transistor T1 may be disposed at the central portion of the pixel. The gate electrode 317 of the first transistor T1 may be disposed between the second scan line 313 and the light emission control line 315 in a plan view. The gate electrode 317 of the first transistor T1 may be separated from the second scan line 313 and the light emission control line 315. In addition, as an example, the gate electrode 317 of the first transistor T1 of the pixel may be separated from adjacent pixels.

The gate electrode 317 of the first transistor T1 overlaps with the first semiconductor layer ACT. A portion of the first semiconductor layer ACT1 disposed in the left row direction from the overlapping portion may be a first electrode region of the first transistor T1, and another portion of the first semiconductor layer ACT disposed in the right row direction from the overlapping portion may be a second electrode region of the first transistor T1.

As described above, the plurality of gate patterns of the first conductive layer 310 may overlap or not overlap with the semiconductor layer ACT disposed therebelow. A region of each semiconductor layer ACT that overlaps with the gate patterns disposed thereabove is a channel region of each semiconductor layer ACT, and regions around the channel region are source and drain regions. For example, the first electrode region and the second electrode region of each of the above-described semiconductor layers ACT may be source and drain regions.

Hereinafter, the first transistor T1 among the plurality of transistors T1 to T7 will be described. However, the following description may also apply to the transistors T2 to T7 other than the first transistor T1.

A region of the first semiconductor layer ACT1 that overlaps with the gate electrode 317 is a channel region CR of the first semiconductor layer ACT1, and regions of the first semiconductor layer ACT1 that do not overlap with the gate electrode 317 are source or drain regions SR and DR of the first semiconductor layer ACT1.

The first conductive layer 310 may include one or more of molybdenum (Mo), aluminum (Al), platinum (Pt), palladium (Pd), silver (Ag), magnesium (Mg), gold (Au), nickel (Ni), neodymium (Nd), iridium (Ir), chrome (Cr), calcium (Ca), titanium (Ti), tantalum (Ta), tungsten (W), and/or copper (Cu). The first conductive layer 310 may be a single film or a multilayer film.

In addition, the channel region of each of the semiconductor layers ACT has a channel length and a channel width. The channel length of the channel region of each of the semiconductor layers ACT refers to a length in a direction along the channel region of each of the semiconductor layers ACT overlapping with the gate patterns thereabove toward the first electrode region (or second electrode region) of each of the semiconductor layers ACT that is adjacent to the channel region. In addition, the channel width of the channel region of each of the semiconductor layers ACT refers to a length in a direction that intersects with the direction from the channel region of each of the semiconductor layers ACT. For example, the channel length may extend in a first direction and the channel width may extend in a second direction crossing the first direction.

As illustrated in FIG. 3, the first semiconductor layer ACT1 of the first transistor T1 may have a channel length L which extends along the horizontal portion in the region overlapping with the gate electrode 317 and a channel width which extends in a direction intersecting with the channel length L. The channel length L of the first semiconductor layer ACT1 may refer to a length extending along a first portion which extends in the upper column direction from a left side of the region of the first semiconductor layer ACT1 overlapping with the gate electrode 317, a second portion which extends in the right row direction from the first portion, and a third portion which extends in the lower column direction from second portion. For example, the channel length L may be along multiple directions. The channel length L of the first semiconductor layer ACT1 may vary according to the shape of the first semiconductor layer ACT1.

Figure 9:
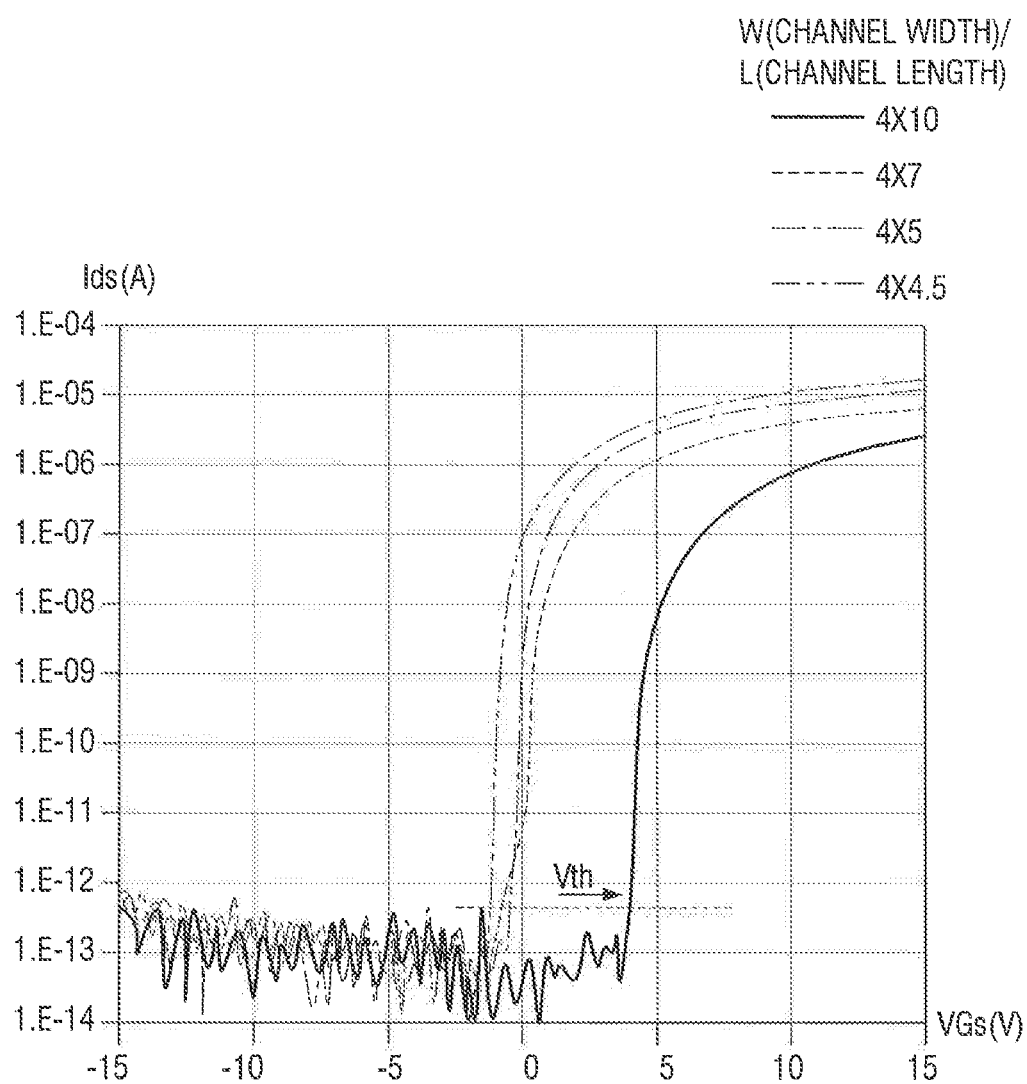
FIG. 9 is a graph showing a threshold voltage (Vth) according to a channel length of a transistor.

Referring to FIG. 9, the horizontal axis of the graph shown in FIG. 9 represents a difference Vgs between a voltage applied to the gate electrode 317 and a voltage applied to the source electrode SE, and the vertical axis represents a driving current Ids provided to the OLED via the drain electrode DE of the first transistor T1.

When the threshold voltage Vth of the first transistor T1 is measured while the channel width is fixed, the threshold voltage Vth of the first transistor T1 may vary as the channel length L changes. As illustrated in FIG. 9, the channel length L of the first semiconductor layer ACT1 and the threshold voltage Vth of the first transistor T1 may be inversely proportional to each other. For example, the threshold voltage Vth of the first transistor T1 may tend to decrease as the channel length L of the first semiconductor layer ACT1 increases.

When the threshold voltage Vth of the first transistor T1 varies, a structure and voltage regulation of an external voltage source for applying a voltage that is equal to or higher than the threshold voltage Vth to the first transistor T1 may become more complex than desired, and thus the simplification of the structure and operation of the display device 1 may be hindered. Therefore, the threshold voltage Vth of the first transistor T1 may be at a predetermined level regardless of the channel length L of the first semiconductor layer ACT1.

In addition, for the threshold voltage Vth of the first transistor T1 to be at a predetermined level regardless of the channel length L, controlling the above-described carrier supporting ions CSI of the channel region CR of the first semiconductor layer ACT1 to be distributed at a predetermined concentration in a channel region regardless of the channel length L may be taken into consideration. For example, since the carrier supporting ions CSI with which the channel region CR is doped serve to lower the threshold voltage Vth of the first transistor T1 as described above, doping the carrier supporting ions CSI in the channel region CR in proportion to the channel length L of the first transistor T1 may be taken into consideration.

In addition, as will be described below, the carrier supporting ions CSI are provided to the first semiconductor layer ACT1 from the second insulating layer 740 disposed at an upper portion of the gate electrode 317. Here, the carrier supporting ions CSI may be provided from a region in which the gate electrode 317 is not disposed. For example, when the channel length L of the region in which the gate electrode 317 and the first semiconductor layer ACT1 overlap with each other, that is, the channel region CR, becomes larger, the number of carrier supporting ions CSI provided to the central portion of the channel region CR may be decreased.

In this case, since the distribution of the carrier supporting ions CSI doped in the overall channel region CR becomes non-uniform, it becomes difficult to regulate the concentration of the carrier supporting ions CSI in the channel region CR as a whole, and as a result, it may become difficult to allow the threshold voltage Vth of the first transistor T1 to be at a predetermined level regardless of the channel length L. In the present disclosure, the term "uniform" may be understood as a term that has a broad concept encompassing a meaning of being substantially uniform as well as a meaning of being completely uniform.

To this end, the gate electrode 317 includes gate holes GH therein which pass through the gate electrode 317 from a surface of the gate electrode 317, and the gate holes GH are disposed around the channel region CR. In this way, the carrier supporting ions CSI may be doped in the channel region CR in proportion to the channel length L of the first transistor T1, and the concentration of the carrier supporting ions CSI doped in the channel region CR may be made uniform regardless of the channel region CR.

As illustrated in FIG. 3, the gate holes GH may have a shape completely surrounded by a material constituting the gate electrode 317. For example, the gate holes GH may have a rectangular or square shape. However, the present invention is not limited thereto. For example, the gate holes GH may have a polygonal shape or a circular shape.

The gate holes GH may be disposed in regions of the gate electrode 317 not overlapping with the first semiconductor layer ACT1 in the thickness direction. For example, the gate holes GH may be disposed around first, second and third portions of the channel region CR of the first semiconductor layer ACT1. The first portion of the channel region CR may be extending in the upper column direction from the left side of the channel region CR. The second portion of the channel region CR may be extending in the right row direction from the first portion of the channel region CR. The third portion of the channel region CR may be extending in the lower column direction from the second portion of the channel region CR. Although the gate holes GH are illustrated in FIG. 3 as being disposed at an upper end of the channel region CR of the first semiconductor layer ACT1, the present invention is not limited thereto, and the gate holes GH may also be disposed at a lower end of the channel region CR of the first semiconductor layer ACT1 that is spaced apart from the upper end while the channel region CR is disposed therebetween.

As illustrated in FIG. 3, an arrangement density of the gate holes GH of the channel region CR may be uniform along the channel region CR.

The gate holes GH of the gate electrode 317 may provide a path that allows the carrier supporting ions CSI provided from the above-described second insulating layer 740 to penetrate through the channel region CR of the first semiconductor layer ACT1.

The second insulating layer 740 serves to insulate the first conductive layer 310 and the second conductive layer 320 from each other. The second insulating layer 740 may be disposed on the first conductive layer 310 and may be disposed on the substrate 710. For example, the second insulating layer 740 may be disposed substantially throughout the entire surface of the substrate 710. For example, the second insulating layer 740 may be an interlayer insulating film.

The second insulating layer 740 may include inorganic insulating materials such as silicon oxide, silicon nitride, silicon oxynitride, hafnium oxide, aluminum oxide, titanium oxide, tantalum oxide, and zinc oxide or organic insulating materials such as polyacrylates resin, epoxy resin, phenolic resin, polyamides resin, polyimides resin, unsaturated polyesters resin, poly phenylenethers resin, polyphenylenesulfides resin, and benzocyclobutene (BCB). The second insulating layer 740 may be a single film or a multilayer film formed of lamination films which are made of materials different from each other. In an exemplary embodiment of the present invention, the second insulating layer 740 may be formed including silicon nitride (SiNx).

Further, as described above, the second insulating layer 740 may further include carrier supporting ions CSI generated in the process of preparing silicon nitride (SiNx). For example, the carrier supporting ions CSI may be hydrogen ions (H+). The carrier supporting ions CSI of the second insulating layer 740 may be provided to the first semiconductor layer ACT1. For example, the second insulating layer 740 may be a carrier supporting ion providing layer.

The second conductive layer 320 may be disposed on the second insulating layer 740. The second conductive layer 320 may include a source electrode SE and a drain electrode DE. The source electrode SE is connected to the source region SR of the first semiconductor layer ACT1 via a contact hole, and the drain electrode DE is connected to the drain region DR via a contact hole. The second conductive layer 320 may further include a plurality of data lines that transmit a data signal DATA (see FIG. 2) and a first source voltage supply line. However, the present invention is not limited thereto. The source electrode SE, the drain electrode DE, and the gate electrode 317 may constitute three terminals of the first transistor T1.

In addition, the carrier supporting ions CSI may further include fluoride ions (F—). The fluoride ions (F—) may be generated upon formation of the contact holes that connect the source region SR and the source electrode SE to each other and connect the drain region DR and the drain electrode DE to each other. For example, the contact holes are formed through a dry etching process. Gases and/or ions that remain after use of fluoric acid (FH) or sulfur hexafluoride ($SF_6$) during the drying etching process may remain around the contact holes. The fluoride ions may penetrate through the first semiconductor layer ACT1 and lower the electrical resistance of the source and drain regions SR and DR of the first semiconductor layer ACT1 and may be provided to a portion of the channel region CR.

In addition, a third conductive layer including an initialization voltage line that supplies an initialization voltage VINT (see FIG. 2), a voltage mesh electrode, and a storage capacitor electrode line may be further disposed between the second insulating layer 740 and the second conductive layer 320.

The third conductive layer may be formed including at least one of the materials listed above as examples of the material constituting the first conductive layer 310.

When the third conductive layer is disposed, the display device 1 may further include a third insulating layer disposed between the third conductive layer and the second conductive layer 320. The third insulating layer may be formed including at least one of the materials listed above as examples of the material constituting the second insulating layer 740. Although the present invention is not limited thereto, the third insulating layer may be made of the same material as that constituting the second insulating layer 740 or, like the second insulating layer 740, serve as a carrier supporting ion providing layer that provides the carrier supporting ions CSI to the first semiconductor layer ACT1.

Referring to FIGS. 3 and 5 to 7, the carrier supporting ions CSI provided from the second insulating layer 740 to the channel region CR of the first semiconductor layer ACT1 may be provided to a region not overlapping with the gate electrode 317. A concentration of the carrier supporting ions CSI in the channel region CR of the first semiconductor layer ACT1 may be lower than a concentration of the carrier supporting ions CSI in the source and drain regions SR and DR of the first semiconductor layer ACT1.

The carrier supporting ions CSI moved to an upper portion PTH1 and a side surface PTH2 of each of the source and drain regions SR and DR of the first semiconductor layer ACT1 may be provided to the channel region CR. For example, with reference to FIGS. 3 and 4, the carrier supporting ions CSI provided from the second insulating layer 740 to the channel region CR of the first semiconductor layer ACT1 may be provided from an upper side and a lower side of the channel region CR. However, when, as described above, the channel length L of the region in which the gate electrode 317 and the first semiconductor layer ACT1 overlap with each other, that is, the channel region CR, becomes larger, a length of a path for allowing the carrier supporting ions CSI, which are moved to the upper portion and the side surface of each of the source and drain regions SR and DR of the first semiconductor layer ACT1, to be provided to the channel region CR may become larger, and the number of carrier supporting ions CSI provided to the central portion of the channel region CR may be decreased.

However, in the display device 1 according to an exemplary embodiment of the present invention, the gate electrode 317 includes the gate holes GH therein which pass through the gate electrode 317 from a surface of the gate electrode 317 that are disposed around the channel region CR, thereby easily adjusting the number of carrier supporting ions CSI provided to the channel region CR. Furthermore, the display device 1 provides a path along which the carrier supporting ions CSI are provided to the central portion of the channel region CR, thereby, as illustrated in FIG. 8, making the concentration of the carrier supporting ions CSI doped in the channel region CR uniform in a direction in which the channel region CR extends. For example, a minimum concentration of the carrier supporting ions CSI in the channel region CR may be within 0.9 times a maximum concentration of the carrier supporting ions CSI.

For example, the concentration of the doped carrier supporting ions CSI may be maintained at a predetermined level regardless of the channel length L of the channel region CR, and in this way, the threshold voltage Vth of the first transistor T1 may be maintained at a predetermined level regardless of the channel length L.

Hereinafter, a display device according to an exemplary embodiment of the present invention will be described. In the following embodiment, the configurations which are the same as those described in the above may be denoted by the same reference numerals, and any description thereof may be omitted or simplified.

Figure 10:
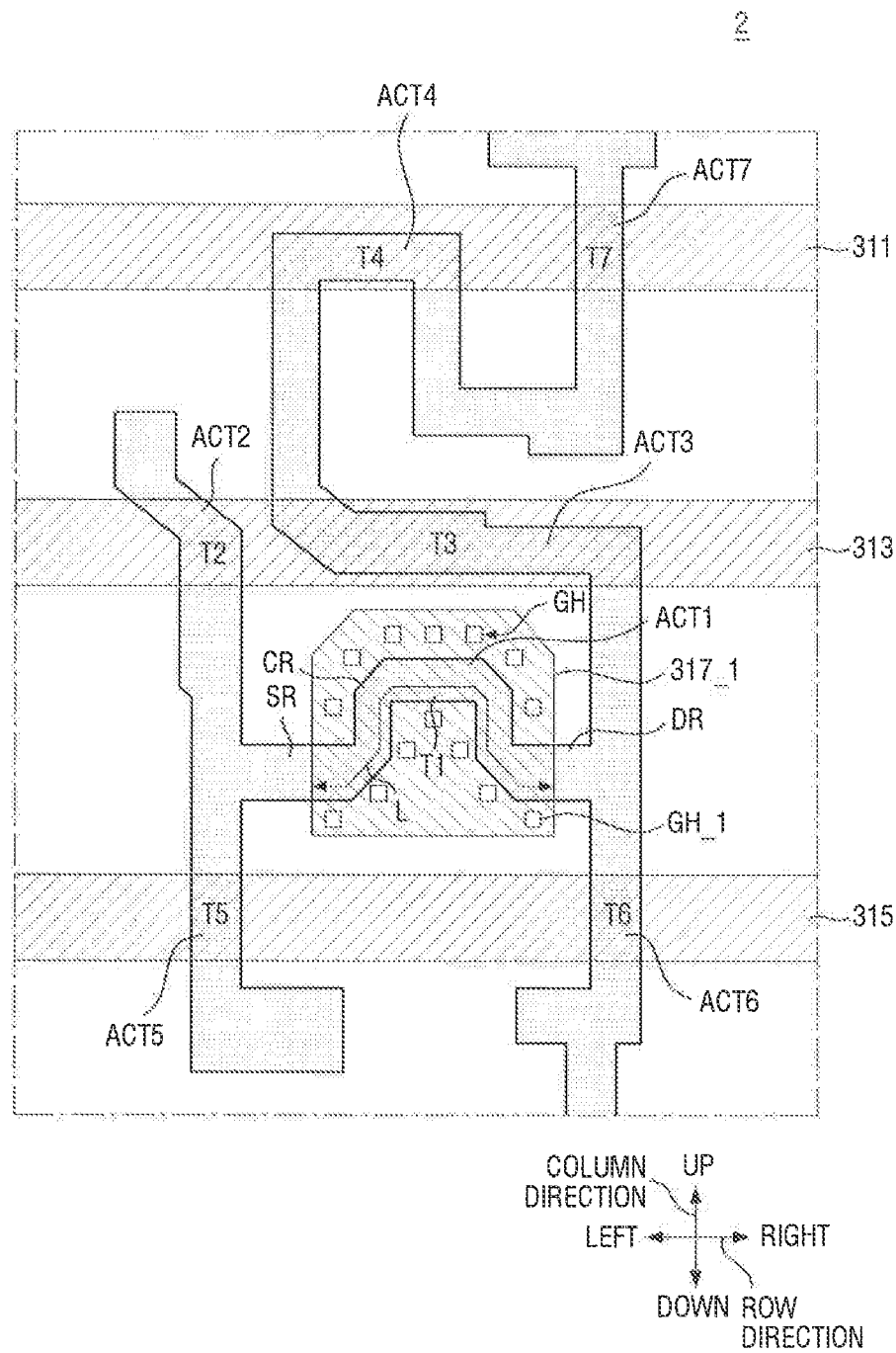
FIG. 10 is a layout diagram illustrating an oxide semiconductor layer and gate patterns of a pixel of a display device according to an exemplary embodiment of the present invention.
Figure 11:
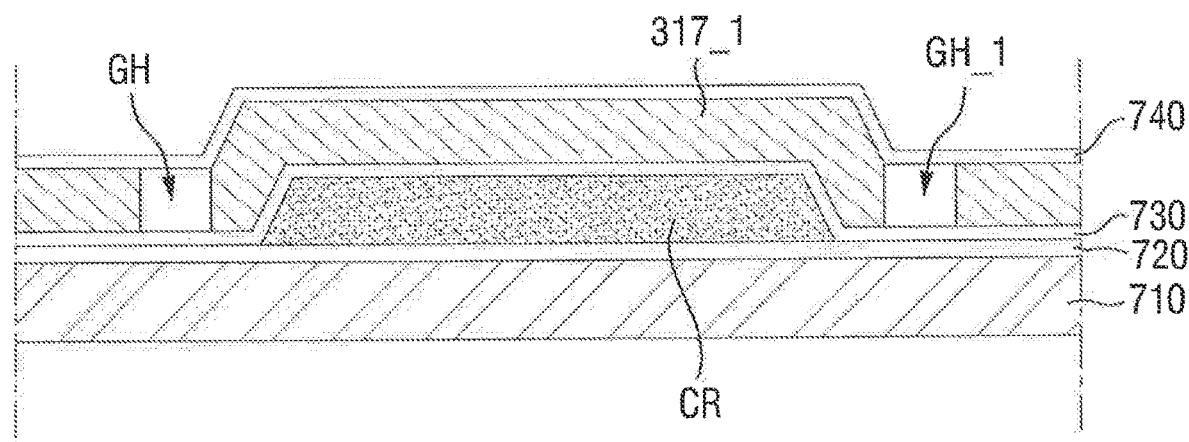
FIG. 11 is a cross-sectional view of FIG. 10.

FIG. 10 is a layout diagram illustrating an oxide semiconductor layer and gate patterns of a pixel of a display device according to an exemplary embodiment of the present invention, and FIG. 11 is a cross-sectional view of FIG. 10.

Referring to FIGS. 10 and 11, a gate electrode 317_1 of a display device 2 according to the present embodiment further includes gate holes GH_1 disposed at a lower end of a channel region CR in a plan view.

For example, the gate electrode 317_1 according to the present embodiment may include gate holes GH disposed at an upper end of the channel region CR in a plan view and the gate holes GH_1 disposed at the lower end of the channel region CR in a plan view. For example, the gate electrode 317_1 may include a first gate electrode region at the upper end of the channel region CR and a second gate electrode region at the lower end of the channel region CR. The gate electrode 317_1 may further include a third gate electrode region that overlaps the channel region CR and is disposed between the first gate electrode region and the second gate electrode region in a plan view.

The gate holes GH_1 disposed at the lower end of the channel region CR in a plan view may pass through the gate electrode 317_1 from a surface of the gate electrode 317_1 in a thickness direction.

Like the gate holes GH according to the mentioned above, the gate holes GH_1 may serve to provide carrier supporting ions CSI to the channel region CR.

As illustrated in FIG. 10, the gate holes GH_1 may have a shape at least partially surrounded by a material constituting the gate electrode 317_1. For example, the gate holes GH_1 may be completely surrounded by the gate electrode 317_1. In addition, the gate holes GH_1 may have a rectangular or square shape. However, the present invention is not limited thereto.

The gate holes GH_1 may be disposed in regions not overlapping with a first semiconductor layer ACT1 in the thickness direction and may be disposed around a first portion extending in the upper column direction from the left side of the channel region CR of the first semiconductor layer ACT1, a second portion extending in the right row direction from the first portion, and a third portion extending in the lower column direction from the second portion.

In the display device 2 according to the present embodiment, the gate electrode 317_1 includes the gate holes GH and GH_1 therein, which pass through the gate electrode 317_1 from a surface of the gate electrode 317_1, that are disposed around the channel region CR, thereby easily adjusting the number of carrier supporting ions CSI provided to the channel region CR. Furthermore, the display device 2 provides a path along which the carrier supporting ions CSI are provided to the central portion of the channel region CR, thereby making the concentration of the carrier supporting ions CSI doped in the channel region CR uniform in a direction in which the channel region CR extends.

For example, the concentration of the doped carrier supporting ions CSI may be maintained at a predetermined level regardless of the channel length L of the channel region CR, and in this way, the threshold voltage Vth of the first transistor T1 may be maintained at a predetermined level regardless of the channel length L.

Figure 12A:
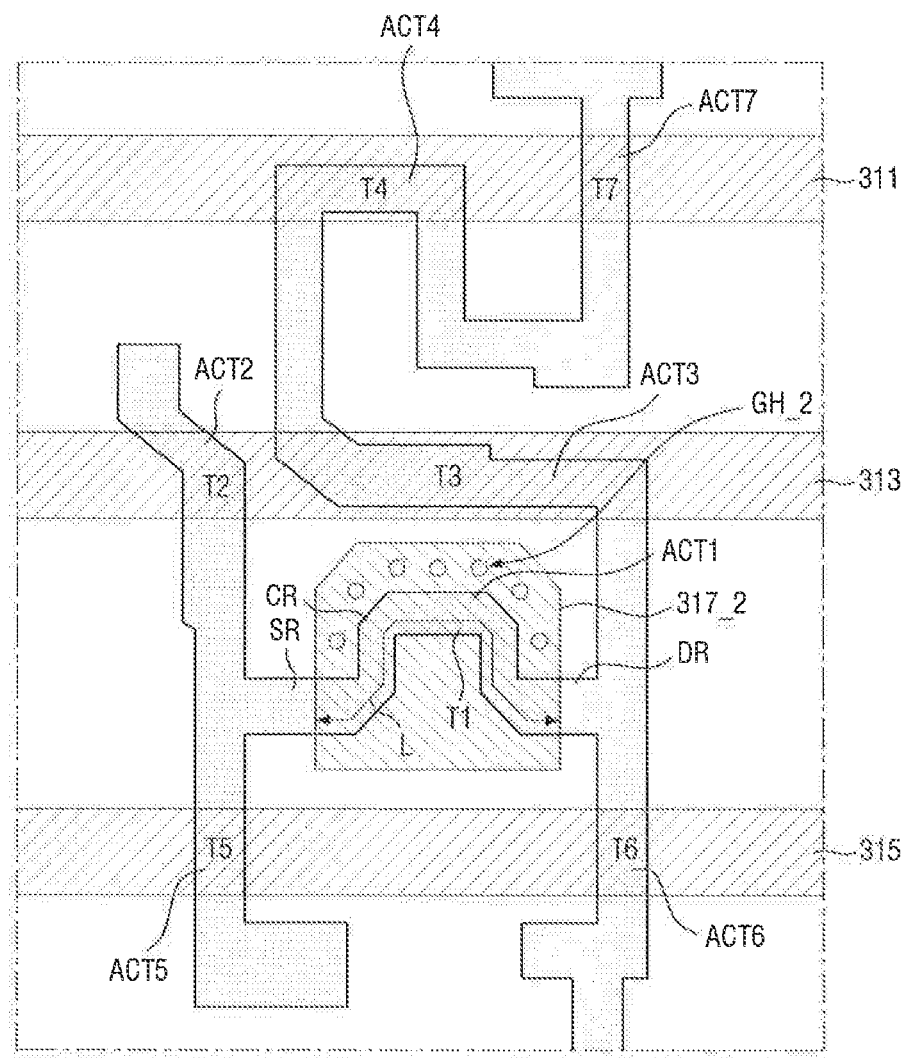
FIGS. 12A and 12B are layout diagrams illustrating an oxide semiconductor layer and gate patterns of a pixel of a display device according to an exemplary embodiment of the present invention.
Figure 12B:
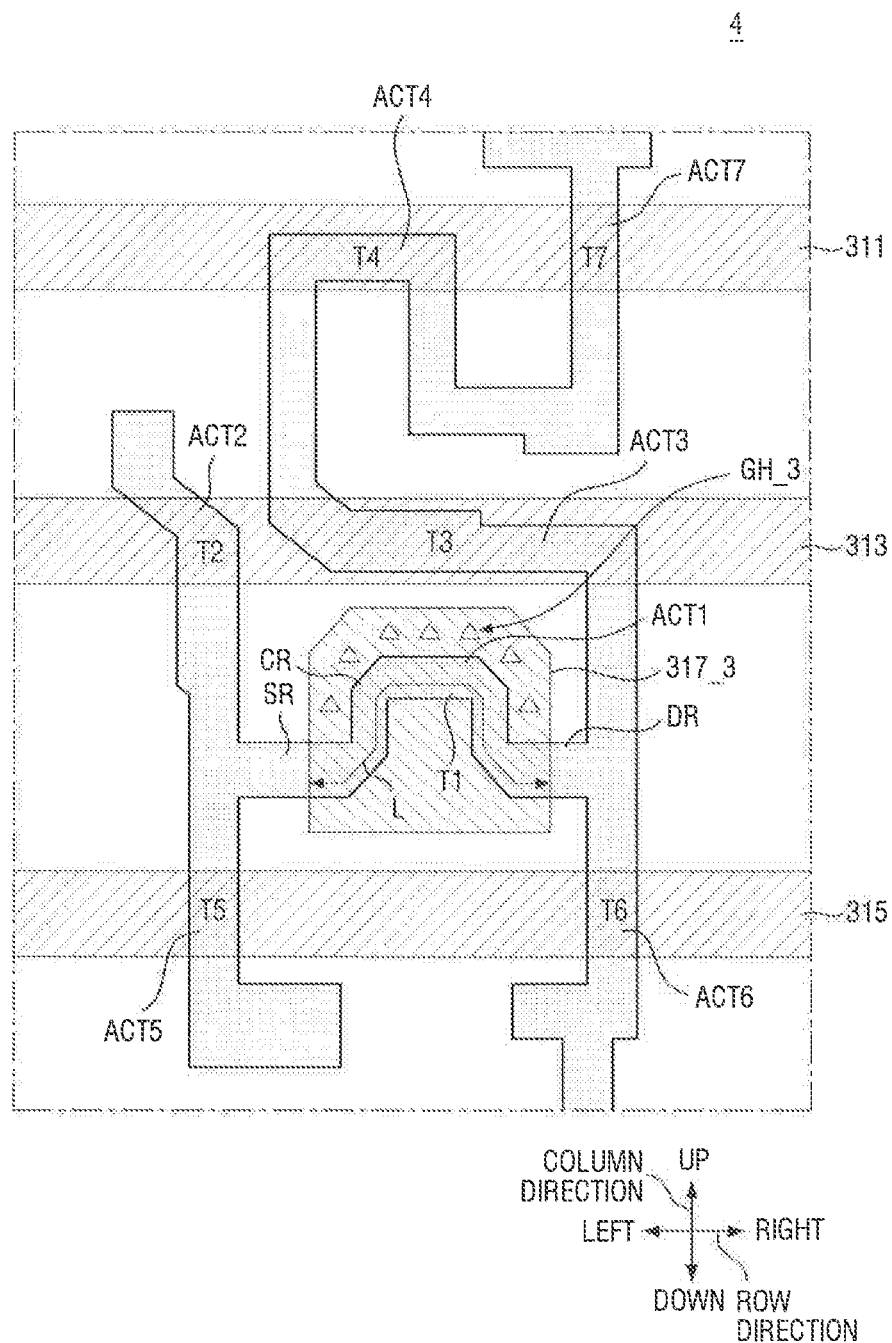

FIGS. 12A and 12B are layout diagrams illustrating an oxide semiconductor layer and gate patterns of a pixel of a display device according to an exemplary embodiment of the present invention.

FIGS. 12A and 12B show that the shape of the gate holes GH according to an exemplary embodiment of the present invention is not limited to the above and may be changed to various shapes.

FIG. 12A shows a case in which a planar shape of gate holes GH_2 is circular or elliptical, and FIG. 12B shows a case in which a planar shape of gate holes GH_3 is triangular.

Even in the cases of the present embodiment, gate electrodes 317_2 and 317_3 include the gate holes GH_2 and GH_3 therein which pass through the gate electrodes 317_2 and 317_3 from surfaces of the gate electrodes 317_2 and 317_3 that are disposed around the channel region CR, thereby easily adjusting the number of carrier supporting ions CSI provided to the channel region CR. Furthermore, the gate electrodes 317_2 and 317_3 provide paths along which the carrier supporting ions CSI are provided to the central portion of the channel region CR, thereby making the concentration of the carrier supporting ions CSI doped in the channel region CR uniform in a direction in which the channel region CR extends.

For example, the concentration of the doped carrier supporting ions CSI may be maintained at a predetermined level regardless of the channel length L of the channel region CR, and in this way, the threshold voltage Vth of the first transistor T1 may be maintained at a predetermined level regardless of the channel length L.

Figure 13:
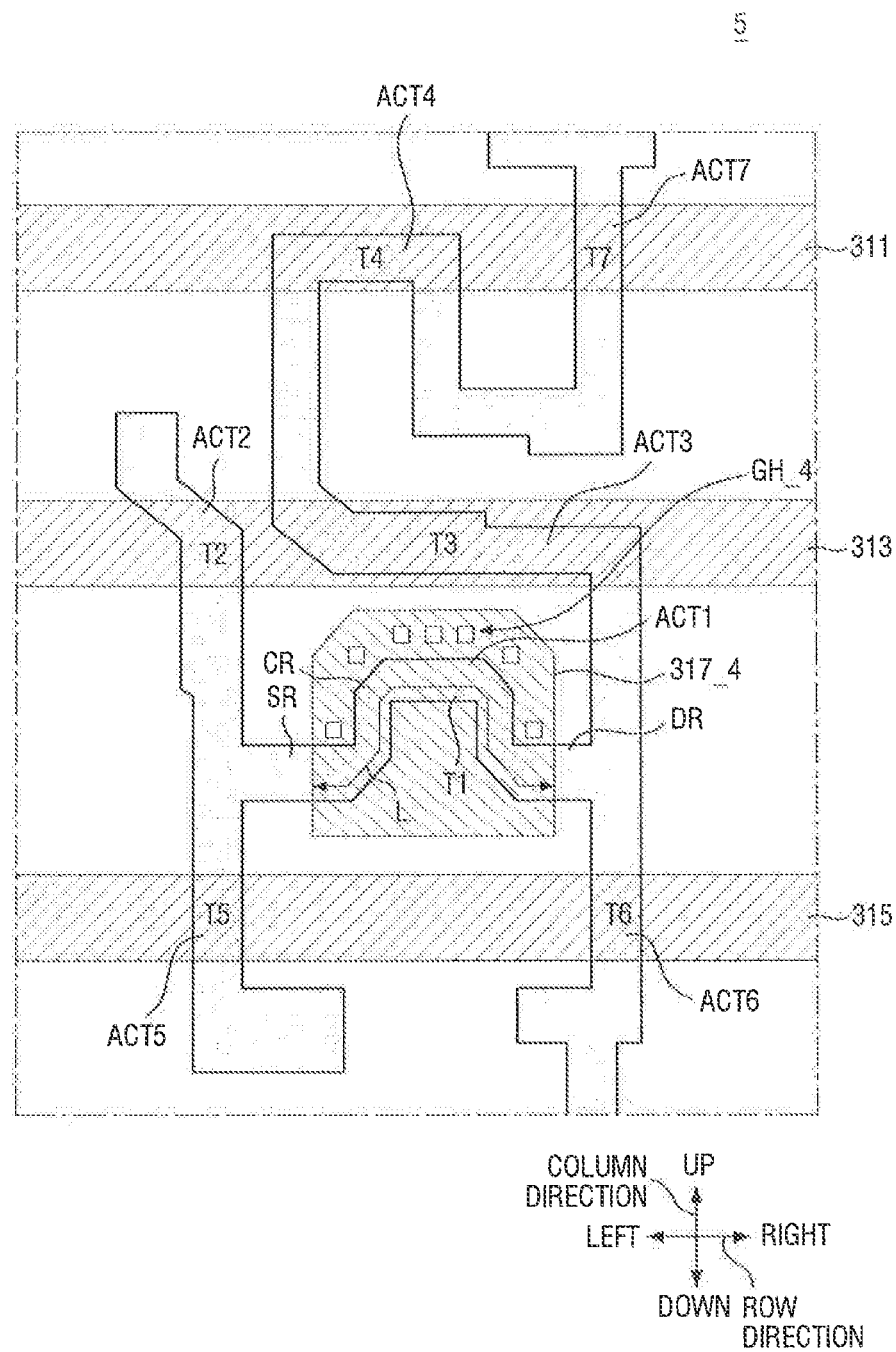
FIG. 13 is a layout diagram illustrating an oxide semiconductor layer and gate patterns of a pixel of a display device according to an exemplary embodiment of the present invention.

FIG. 13 is a layout diagram illustrating an oxide semiconductor layer and gate patterns of a pixel of a display device according to an exemplary embodiment of the present invention.

Referring to FIG. 13, a gate electrode 317_4 of a display device 5 according to the present embodiment is different from the gate electrode 317 of the display device 1 according to FIG. 3 in that an arrangement density of gate holes GH_4 varies along a channel region CR.

For example, in the gate electrode 317_4 according to the present embodiment, an arrangement density of the gate holes GH_4 may vary. For example, the arrangement density of the gate holes GH_4 may gradually increase from a boundaries of a channel region CR adjacent to source and drain regions SR and DR, that is, from an edge of the channel region CR, toward a central portion of the channel region CR.

As described above, the carrier supporting ions CSI which are moved to the upper portion and the side surface of each of the source and drain regions SR and DR of the first semiconductor layer ACT1 may be provided to the channel region CR. Here, when a channel length L of a region in which the gate electrode 317_4 and the first semiconductor layer ACT1 overlap with each other, that is, the channel region CR, becomes larger, a length of a path for allowing the carrier supporting ions CSI, which are moved to the upper portion and the side surface of each of the source and drain regions SR and DR of the first semiconductor layer ACT1, to be provided to the channel region CR may become larger, and the number of carrier supporting ions CSI provided to the central portion of the channel region CR may be decreased.

However, since the arrangement density of the gate holes GH_4 varies along the channel region CR in the display device 5 according to the present embodiment, the number of carrier supporting ions CSI provided to the central portion of the channel region CR may be increased. In this way, the concentration of the carrier supporting ions CSI doped in the channel region CR may be made uniform in a direction in which the channel region CR extends.

FIG. 14 is a layout diagram illustrating an oxide semiconductor layer and gate patterns of a pixel of a display device according to an exemplary embodiment of the present invention.

Referring to FIG. 14, a gate electrode 317_5 of a display device 6 according to the present embodiment is different from the gate electrode 317_1 of the display device 2 according to FIG. 10 in that an arrangement density of gate holes in the gate electrode 317-_5 gradually increases toward a central portion of a channel region CR.

For example, in the display device 6 according to the present embodiment, the arrangement density of the gate holes in the gate electrode 317_5 may gradually increase toward the central portion of the channel region CR. Since this has already been described above with reference to FIG.

13, redundant description will be omitted. For example, FIG. 14 illustrates that, in the gate electrode 317_5 according to the present embodiment, the arrangement density of the gate holes GH_1a disposed at an upper end and a lower end of the channel region CR in a plan view may gradually increase toward the central portion of the channel region CR.

Even in the case of the present embodiment, as described above, the carrier supporting ions CSI which are moved to the upper portion and the side surface of each of the source and drain regions SR and DR of the first semiconductor layer ACT1 may be provided to the channel region CR. Here, when a channel length L of the channel region CR becomes larger, a length of a path for allowing the carrier supporting ions CSI, which are moved to the upper portion and the side surface of each of the source and drain regions SR and DR of the first semiconductor layer ACT1, to be provided to the channel region CR may become larger, and the number of carrier supporting ions CSI provided to the central portion of the channel region CR may be decreased.

However, since arrangement densities of gate holes GH_4 and GH_1a vary along the channel region CR in the display device 6 according to the present embodiment, the number of carrier supporting ions CSI provided to the central portion of the channel region CR may be increased. In this way, the concentration of the carrier supporting ions CSI doped in the channel region CR may be made uniform in a direction in which the channel region CR extends.

Figure 16:
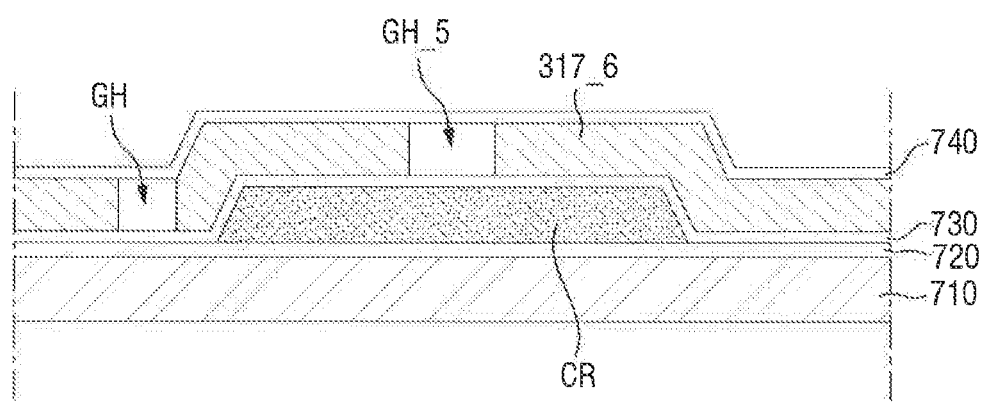
FIG. 16 is a cross-sectional view of FIG. 15.

FIG. 15 is a layout diagram illustrating an oxide semiconductor layer and gate patterns of a pixel of a display device according to an exemplary embodiment of the present invention, and FIG. 16 is a cross-sectional view of FIG. 15.

Referring to FIGS. 15 and 16, a display device 7 according to the present embodiment is different from the display device 1 according to FIG. 3 in that a gate electrode 317_6 further includes gate holes GH_5 disposed in a region overlapping with a channel region CR.

For example, in the display device 7 according to the present embodiment, the gate electrode 317_6 may further include the gate holes GH_5 disposed in the region overlapping with the channel region CR.

The gate holes GH_5 overlapping with the channel region CR may pass through the gate electrode 317_6 from a surface of the gate electrode 317_6 in a thickness direction.

Like the gate holes GH according to the above descriptions, the gate holes GH_5 may serve to provide the carrier supporting ions CSI to the channel region CR.

As illustrated in FIG. 15, the gate holes GH_5 may have a shape at least partially surrounded by a material constituting the gate electrode 317_6. Also, the gate holes GH_5 may have a rectangular or square shape. However, the present invention is not limited thereto.

In the display device 7 according to the present embodiment, the gate electrode 317_6 includes the gate holes GH and GH_5 therein which pass through the gate electrode 317_6 from a surface of the gate electrode 317_6 that are disposed around the channel region CR, thereby easily adjusting the number of carrier supporting ions CSI provided to the channel region CR. Furthermore, the display device 7 provides a path along which the carrier supporting ions CSI are provided to the central portion of the channel region CR, thereby making the concentration of the carrier supporting ions CSI doped in the channel region CR uniform in a direction in which the channel region CR extends.

For example, the concentration of the doped carrier supporting ions CSI may be maintained at a predetermined level regardless of the channel length L of the channel region CR, and in this way, the threshold voltage Vth of the first transistor T1 may be maintained at a predetermined level regardless of the channel length L.

Figure 17:
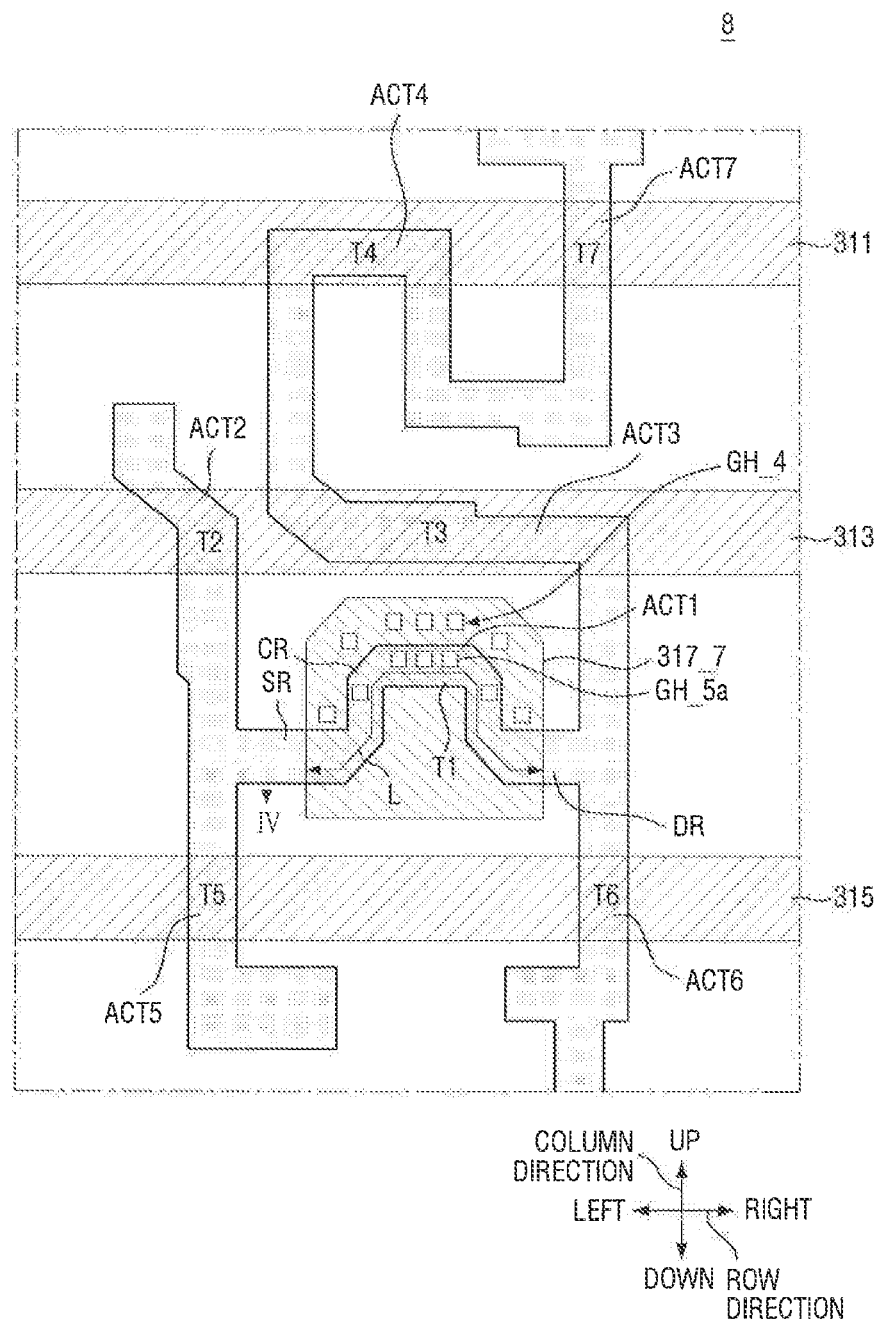
FIG. 17 is a layout diagram illustrating an oxide semiconductor layer and gate patterns of a pixel of a display device according to an exemplary embodiment of the present invention.

FIG. 17 is a layout diagram illustrating an oxide semiconductor layer and gate patterns of a pixel of a display device according to an exemplary embodiment of the present invention.

Referring to FIG. 17, a display device 8 according to the present embodiment is different from that of FIGS. 15 and 16 in that arrangement densities of gate holes GH_4 disposed in a region not overlapping with a channel region CR and gate holes GH_5a disposed in a region overlapping with the channel region CR vary along the channel region CR.

For example, in the display device 8 according to the present embodiment, an arrangement density of gate holes in a gate electrode 317_7 may gradually increase toward a central portion of the channel region CR. Since this has already been described above with reference to FIG. 13, redundant descriptions will be omitted. For example, FIG. 17 illustrates that, in the gate electrode 317_7 according to the present embodiment, the arrangement densities of the gate holes GH_4 and GH_5a respectively disposed in the region not overlapping with the channel region CR and in the region overlapping with the channel region CR may gradually increase toward the central portion of the channel region CR.

Even in the case of the present embodiment, as described above, the carrier supporting ions CSI which are moved to the upper portion and the side surface of each of the source and drain regions SR and DR of the first semiconductor layer ACT1 may be provided to the channel region CR. Here, when a channel length L of the channel region CR becomes larger, a length of a path for allowing the carrier supporting ions CSI, which are moved to the upper portion and the side surface of each of the source and drain regions SR and DR of the first semiconductor layer ACT1, to be provided to the channel region CR may become larger, and the number of carrier supporting ions CSI provided to the central portion of the channel region CR may be decreased.

However, since the arrangement densities of gate holes GH_4 and GH_5a vary along the channel region CR in the display device 8 according to the present embodiment, the number of carrier supporting ions CSI provided to the central portion of the channel region CR may be increased. In this way, the concentration of the carrier supporting ions CSI doped in the channel region CR may be made uniform in a direction in which the channel region CR extends FIG. 18 is a layout diagram illustrating an oxide semiconductor layer and gate patterns of a pixel of a display device according to an exemplary embodiment of the present invention, and FIG. 19 is a cross-sectional view of FIG. 18.

Figure 19:
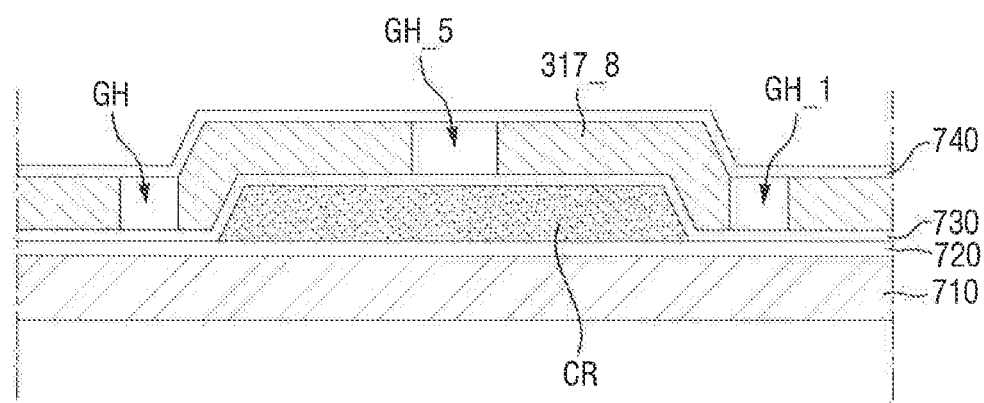
FIG. 19 is a cross-sectional view of FIG. 18.

Referring to FIGS. 18 and 19, a display device 9 according to the present embodiment is different from that of FIG. 10 in that the display device 9 further includes the gate holes GH_5 according to FIG. 15 which are disposed to overlap with the channel region CR.

For example, the display device 9 according to the present embodiment may include gate holes GH disposed at an upper end of a channel region CR in a plan view, gate holes GH_1 disposed at a lower end of the channel region CR in a plan view, and gate holes GH_5 disposed to overlap with the channel region CR.

Since the description thereof has been given above with reference to FIGS. 10 to 15, redundant description will be omitted.

According to an exemplary embodiment of the present invention, a display device in which a concentration of carrier supporting ions is uniform in a channel region of a semiconductor layer can be provided.

While the present invention has been particularly shown and described with reference to exemplary embodiments thereof, it will be apparent to those of ordinary skill in the art that various changes in form and detail may be made thereto without departing from the spirit and scope of the present invention as defined by the following claims.

What is claimed is:

1. A display device comprising:
    a substrate;
    a gate pattern disposed on the substrate;
    an oxide semiconductor layer disposed on the substrate, the oxide semiconductor layer includes a channel region that overlaps with the gate pattern; and
    an insulating film disposed on the gate pattern, the insulating film includes majority carrier supporting ions,
    wherein the gate pattern includes a plurality of gate holes,
        wherein the gate holes are formed inside a region of the gate pattern that does not overlap with the channel region of the oxide semiconductor layer, and
    wherein the channel region of the oxide semiconductor layer includes the majority carrier supporting ions.

2. The display device of claim 1, wherein the insulating film includes silicon nitride (SiNx) and is configured to provide the majority carrier supporting ions to the channel region of the oxide semiconductor layer via the plurality of gate holes.

3. The display device of claim 2, wherein the majority carrier supporting ions include hydrogen ions.

4. The display device of claim 1, wherein the oxide semiconductor layer further includes a source region and a drain region, wherein the source region is disposed adjacent to the channel region, wherein the drain region is spaced apart from the source region, and wherein the channel region is disposed between source region and the drain region.

5. The display device of claim 4, wherein the source region and the drain region do not overlap with the gate pattern in a thickness direction.

6. The display device of claim 5, wherein a concentration of the majority carrier supporting ions in the source region and the drain region is higher than a concentration of the majority carrier supporting ions in the channel region.

7. The display device of claim 5, further comprising a source electrode and a drain electrode disposed on the insulating film,
    wherein the source electrode contacts the source region,
    wherein the drain electrode contacts the drain region, and
    wherein the oxide semiconductor layer, the gate pattern, the source electrode, and the drain electrode constitute a transistor.

8. The display device of claim 7, further comprising a light emitting diode,
    wherein the transistor includes a driving transistor configured to transmit a driving current to the light emitting diode.

9. The display device of claim 1, wherein a concentration of the majority carrier supporting ions is substantially uniform in the channel region.

10. The display device of claim 9, wherein a minimum concentration of the majority carrier supporting ions in the channel region is within 0.9 times a maximum concentration of the majority carrier supporting ions in the channel region.

11. The display device of claim 1, wherein the plurality of gate holes are at least partially surrounded by the gate pattern and pass through the gate pattern from a surface of the gate pattern.

12. The display device of claim 1, wherein the plurality of gate holes are arranged in a direction in which the channel region of the oxide semiconductor layer extends.

13. The display device of claim 12, wherein:
    the gate pattern includes a first gate pattern region, a second gate pattern region, and a third gate pattern region that overlaps with the channel region of the oxide semiconductor layer and is disposed between the first gate pattern region and the second gate pattern region; and
    the gate holes are disposed in the first gate pattern region and the second gate pattern region.

14. The display device of claim 12, wherein an arrangement density of the plurality of gate holes increases toward a central portion of the channel region of the oxide semiconductor layer.

15. The display device of claim 1, wherein the plurality of gate holes of the gate pattern are further disposed in a region, of the gate pattern overlapping with the channel region of the oxide semiconductor layer.

16. The display device of claim 15, wherein an arrangement density of the plurality of gate holes disposed in the region of the gate pattern overlapping with the channel region is lower than an arrangement density of the plurality of gate holes disposed in the region of the gate pattern not overlapping with the channel region.

17. A display device comprising:
    a substrate;
    a gate pattern disposed on the substrate;
    an oxide semiconductor layer disposed on the substrate, the oxide semiconductor layer includes a channel region that overlaps with the gate pattern; and
    an insulating film disposed on an upper portion of the gate pattern,
    wherein the gate pattern includes a plurality of gate holes,
        wherein the gate holes are formed inside a region of the gate pattern that does not overlap with the channel region of the oxide semiconductor layer,
    wherein the insulating film is configured to provide majority carrier supporting ions to the channel region of the oxide semiconductor layer via the plurality of gate holes, and
    a concentration of the majority carrier supporting ions is substantially uniform in the channel region of the oxide semiconductor layer.

18. The display device of claim 17, wherein:
    the majority carrier supporting ions include hydrogen ions, and
    a minimum concentration of the hydrogen ions in the channel region is within 0.9 times a maximum concentration of the hydrogen ions in the channel region.

19. The display device of claim 17, wherein the plurality of gate holes of the gate pattern are further disposed in a region of the gate pattern that overlaps with the channel region of the oxide semiconductor layer.

20. The display device of claim 17, wherein an arrangement density of the plurality of gate holes disposed in the region of the gate pattern overlapping with the channel region is lower than an arrangement density of the plurality of gate holes disposed in the region of the gate pattern not overlapping with the channel region.

* * * * *